(12) United States Patent
Park et al.

(10) Patent No.: US 11,527,204 B2
(45) Date of Patent: Dec. 13, 2022

(54) DISPLAY APPARATUS AND METHOD OF DRIVING DISPLAY PANEL USING THE SAME

(71) Applicant: Samsung Display Co., Ltd., Yongin-Si (KR)

(72) Inventors: Se Hyuk Park, Seongnam-si (KR); Hong Soo Kim, Hwaseong-si (KR); Jin Young Roh, Hwaseong-si (KR); Hyo Jin Lee, Yongin-si (KR); Jae Keun Lim, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/524,649

(22) Filed: Nov. 11, 2021

(65) Prior Publication Data

US 2022/0068209 A1 Mar. 3, 2022

Related U.S. Application Data

(63) Continuation of application No. 17/014,969, filed on Sep. 8, 2020, now Pat. No. 11,195,468.

(30) Foreign Application Priority Data

Oct. 28, 2019 (KR) .................. 10-2019-0134552

(51) Int. Cl.
*G09G 3/36* (2006.01)
*G09G 3/3258* (2016.01)
(Continued)

(52) U.S. Cl.
CPC ......... *G09G 3/3258* (2013.01); *G09G 3/3291* (2013.01); *H01L 27/3262* (2013.01);
(Continued)

(58) Field of Classification Search
CPC ...... G09G 3/32; G09G 3/3258; G09G 3/3266; G09G 3/3291; G09G 2320/02;
(Continued)

(56) References Cited

U.S. PATENT DOCUMENTS

2011/0038220 A1\* 2/2011 Won .................... G11C 11/4074
365/207
2017/0018234 A1\* 1/2017 Na ....................... G09G 3/3406
(Continued)

FOREIGN PATENT DOCUMENTS

KR 10-0684951 B1 2/2007
KR 10-2015-0061548 A 6/2015
(Continued)

*Primary Examiner* — Pegeman Karimi
(74) *Attorney, Agent, or Firm* — Innovation Counsel LLP

(57) ABSTRACT

A display apparatus includes a display panel, a first gate driver, a second gate driver, a third gate driver, and a data driver. The display apparatus is operable in a low frequency driving mode, and the low frequency driving mode includes a writing frame and a holding frame. At least one of gate power voltages used to generate a first gate signal, a second gate signal, and an emission signal has a first voltage level in the writing frame of the low frequency driving mode and a second voltage level in the holding frame of the low frequency driving mode. The data voltage is applied to the pixel in the writing frame of the low frequency driving mode. The data voltage applied to the pixel in the writing frame of the low frequency driving mode is maintained in the holding frame of the low frequency driving mode.

21 Claims, 13 Drawing Sheets

(51) Int. Cl.
  *G09G 3/3291* (2016.01)
  *H01L 27/32* (2006.01)
  H01L 29/786 (2006.01)
  H01L 27/12 (2006.01)

(52) U.S. Cl.
  CPC . *G09G 2300/0426* (2013.01); *G09G 2310/08* (2013.01); *H01L 27/1225* (2013.01); *H01L 29/7869* (2013.01); *H01L 29/78672* (2013.01)

(58) Field of Classification Search
  CPC .... G09G 2300/0443; G09G 3/34; G09G 3/30; H01L 27/32; H01L 27/3262; H01L 29/78; H01L 29/78696; H01L 29/7869; H01L 27/1225
  See application file for complete search history.

(56) References Cited

U.S. PATENT DOCUMENTS

| | | | |
|---|---|---|---|
| 2017/0092191 A1* | 3/2017 | An | G09G 3/3233 |
| 2017/0098413 A1* | 4/2017 | Lee | G09G 3/3233 |
| 2018/0293939 A1* | 10/2018 | Kim | H01L 51/5203 |
| 2020/0219450 A1 | 7/2020 | Lee et al. | |

FOREIGN PATENT DOCUMENTS

| | | |
|---|---|---|
| KR | 10-1908497 B1 | 10/2018 |
| KR | 10-2019-0034375 A | 4/2019 |
| KR | 10-2020-0034086 A | 3/2020 |
| KR | 10-2020-0086783 A | 7/2020 |

\* cited by examiner

DISPLAY APPARATUS AND METHOD OF DRIVING DISPLAY PANEL USING THE SAME

PRIORITY STATEMENT

This application is a continuation of U.S. patent application Ser. No. 17/014,969 filed on Sep. 8, 2020, which claims priority under 35 U.S.C. § 119 to Korean Patent Application No. 10-2019-0134552, filed on Oct. 28, 2019 in the Korean Intellectual Property Office (KIPO), the disclosures of which are incorporated herein by reference in its entirety.

BACKGROUND

1. Field

The present disclosure relates to a display apparatus including a display driver and a method of driving a display panel using the display panel driver of the display apparatus. More particularly, the present disclosure relates to a display apparatus including a display driver and operable to reduce power consumption and a method of driving a display panel using the display panel driver of the display apparatus.

2. Description of the Related Art

Generally, a display apparatus includes a display panel and a display panel driver. The display panel includes a plurality of gate lines, a plurality of data lines, a plurality of emission lines, and a plurality of pixels. The display panel driver may include a gate driver, a data driver, an emission driver, and a driving controller. The gate driver outputs gate signals to the gate lines, the data driver outputs data voltages to the data lines, the emission driver outputs emission signals to the emission lines, and the driving controller controls the gate driver, the data driver, and the emission driver.

When the display panel displays a static image or the display apparatus is operated in an always-on mode, the display panel driver may reduce a driving frequency of the display panel to reduce the power consumption.

When the driving frequency of the display panel is reduced, but a gate power voltage maintains a direct-current ("DC") level, power consumption of the gate driver may not be sufficiently reduced.

SUMMARY

The present disclosure provides a display apparatus capable of reducing power consumption of a display apparatus.

The present disclosure also provides a method of driving a display panel using the display apparatus.

In an example embodiment of the present inventive concept, a display apparatus includes a display panel including a pixel, a first gate driver configured to output a first gate signal to the first switching element of the first type, a second gate driver configured to output a second gate signal to the second switching element of the second type, a third gate driver configured to output an emission signal to the pixel, and a data driver configured to output a data voltage to the pixel. The pixel includes a first switching element of a first type and a second switching element of a second type that is different from the first type. The display apparatus is operable in a low frequency driving mode, and the low frequency driving mode includes a writing frame and a holding frame. At least one of gate power voltages to generate the first gate signal, the second gate signal, and the emission signal has a first voltage level in the writing frame of the low frequency driving mode and a second voltage level that is different from the first voltage level in the holding frame of the low frequency driving mode. The data voltage is applied to the pixel in the writing frame of the low frequency driving mode. The data voltage applied to the pixel in the writing frame of the low frequency driving mode is maintained in the holding frame of the low frequency driving mode.

In an example embodiment, the first switching element of the first type may be a polysilicon thin film transistor. The second switching element of the second type may be an oxide thin film transistor.

In an example embodiment, the first switching element of the first type may be a p-type transistor. The second switching element of the second type may be an n-type transistor.

In an example embodiment, the pixel may include: a light emitting element including an anode electrode and a cathode electrode to which a low power voltage is applied; a first pixel switching element including a first control electrode connected to a first node, a first input electrode connected to a second node, and a first output electrode connected to a third node; a second pixel switching element including a second control electrode to which the first gate signal is applied, a second input electrode to which the data voltage is applied, and a second output electrode connected to the second node; a third pixel switching element including a third control electrode to which the second gate signal is applied, a third input electrode connected to the first node, and a third output electrode connected to the third node; a fourth pixel switching element including a fourth control electrode to which a data initialization gate signal is applied, a fourth input electrode to which an initialization voltage is applied, and a fourth output electrode connected to the first node; a fifth pixel switching element including a fifth control electrode to which the emission signal is applied, a fifth input electrode to which a high power voltage is applied and, a fifth output electrode connected to the second node; a sixth pixel switching element including a sixth control electrode to which the emission signal is applied, a sixth input electrode connected to the third node, and a sixth output electrode connected to an anode electrode of an organic light emitting element; a seventh pixel switching element including a seventh control electrode to which an organic light emitting element initialization gate signal is applied, a seventh input electrode to which the initialization voltage is applied, and a seventh output electrode connected to the anode electrode of the organic light emitting element, and a storage capacitor including a first electrode to which the high power voltage is applied and a second electrode connected to the first node.

In an example embodiment, the first pixel switching element, the second pixel switching element, the fifth pixel switching element, and the sixth pixel switching element may be polysilicon thin film transistors. The third pixel switching element, the fourth pixel switching element, and the seventh pixel switching element may be oxide thin film transistors.

In an example embodiment, the first gate signal and the second gate signal may have a first frequency in the low frequency driving mode. The emission signal may have a second frequency that is greater than the first frequency in the low frequency driving mode.

In an example embodiment, the first gate signal and the second gate signal may be generated based on a first gate high level and a first gate low level in the writing frame of the low frequency driving mode. The first gate signal and the second gate signal may be generated based on a second gate high level that is lower than the first gate high level and a second gate low level that is greater than the first gate low level in the holding frame of the low frequency driving mode.

In an example embodiment, the emission signal may be generated based on a direct-current ("DC") voltage in the low frequency driving mode.

In an example embodiment, the emission signal may be generated based on the first gate high level and the first gate low level in the writing frame of the low frequency driving mode and in the holding frame of the low frequency driving mode.

In an example embodiment, the second gate signal may have a first frequency in the low frequency driving mode. The first gate signal and the emission signal may have a second frequency that is greater than the first frequency in the low frequency driving mode.

In an example embodiment, the second gate signal may be generated based on a first gate high level and a first gate low level in the writing frame of the low frequency driving mode. The second gate signal may be generated based on a second gate high level that is lower than the first gate high level and a second gate low level that is greater than the first gate low level in the holding frame of the low frequency driving mode.

In an example embodiment, the first gate signal and the emission signal may be generated based on a direct-current ("DC") voltage in the low frequency driving mode.

In an example embodiment, the first gate signal and the emission signal may be generated based on the first gate high level and the first gate low level in the writing frame of the low frequency driving mode and in the holding frame of the low frequency driving mode.

In an example embodiment, the first gate signal may have a first frequency in the low frequency driving mode. The second gate signal may have a second frequency in the low frequency driving mode. The emission signal may have a third frequency that is greater than the first frequency and the second frequency in the low frequency driving mode.

In an example embodiment, the second gate signal may be generated based on a first gate high level and a first gate low level in the writing frame of the low frequency driving mode. The second gate signal may be generated based on a second gate high level that is lower than the first gate high level and a second gate low level that is greater than the first gate low level in the holding frame of the low frequency driving mode.

In an example embodiment, the first gate signal may be generated based on the first gate high level and the first gate low level in the writing frame of the low frequency driving mode. The first gate signal may be generated based on the second gate high level and the second gate low level in at least one of a plurality of holding frames of the low frequency driving mode.

In an example embodiment, the emission signal may be generated based on a direct-current ("DC") voltage in the low frequency driving mode.

In an example embodiment, the emission signal may be generated based on the first gate high level and the first gate low level in the writing frame of the low frequency driving mode and the holding frame of the low frequency driving mode.

In an example embodiment, the first frequency of the first gate signal may be that is greater than the second frequency of the second gate signal in the low frequency driving mode.

In an example embodiment, the display apparatus may further include a level shifter configured to generate a first gate clock signal, a second gate clock signal and a third gate clock signal based on a first native gate signal, a second native gate signal, a third native gate signal, and the gate power voltages. The level shifter may be further configured to respectively output the first gate clock signal, the second gate clock signal, and the third gate clock signal to the first gate driver, the second gate driver, and the third gate driver. The display apparatus may further include a first high voltage generator configured to generate a first gate high level; a second high voltage generator configured to generate a second gate high level; a first low voltage generator configured to generate a first gate low level; a second low voltage generator configured to generate a second gate low level; a first switch configured to selectively output one of the first gate high level and the second gate high level to the level shifter; and a second switch configured to selectively output one of the first gate low level and the second gate low level to the level shifter.

In an example embodiment, the display apparatus may further include a driving controller. The driving controller may include the level shifter, the first high voltage generator, the second high voltage generator, the first low voltage generator, the second low voltage generator, the first switch, and the second switch.

In an example embodiment, the display apparatus may further include a driving controller and a power voltage generator. The driving controller may include the level shifter. The power voltage generator may include the first high voltage generator, the second high voltage generator, the first low voltage generator, the second low voltage generator, the first switch, and the second switch.

In an example embodiment of a method of driving a display panel, the method includes outputting a first gate signal to a first switching element of a pixel of the display panel, outputting a second gate signal to a second switching element of the pixel of the display panel, outputting an emission signal to the pixel; and outputting a data voltage to the pixel. The first switching element is of a first type, and the second switching element is of a second type that is different from the first type. The display panel is operable in a low frequency driving, and the low frequency driving mode includes a writing frame and a holding frame. At least one of gate power voltages used to generate the first gate signal, the second gate signal, and the emission signal has a first voltage level in the writing frame of the low frequency driving mode and a second voltage level in the holding frame of the low frequency driving mode. The data voltage is applied to the pixel in the writing frame of the low frequency driving mode. The data voltage applied to the pixel in the writing frame of the low frequency driving mode is maintained in the pixel in the holding frame of the low frequency driving mode.

According to the display apparatus and the method of driving the display panel of the display apparatus, the driving frequency of the display panel is determined according to the input image data of the display panel to reduce the power consumption of the display apparatus. In addition, the high level of the gate power voltage is decreased, and the low level of the gate power voltage is increased in the holding frame of the low frequency driving mode to further reduce the power consumption of the display apparatus. At least one of the gate power voltages used to generate the first gate signal applied to the switching element of the first type, the second gate signal applied to the switching element of the second type, and the emission signal may be differentiated to enhance the efficiency of the power consumption reduction.

BRIEF DESCRIPTION OF THE DRAWINGS

The above and other features and advantages of the present inventive concept will become more apparent by describing in detail example embodiments thereof with reference to the accompanying drawings, in which.

DETAILED DESCRIPTION OF THE INVENTIVE CONCEPT

Hereinafter, the present inventive concept will be explained in detail with reference to the accompanying drawings.

Figure 1:
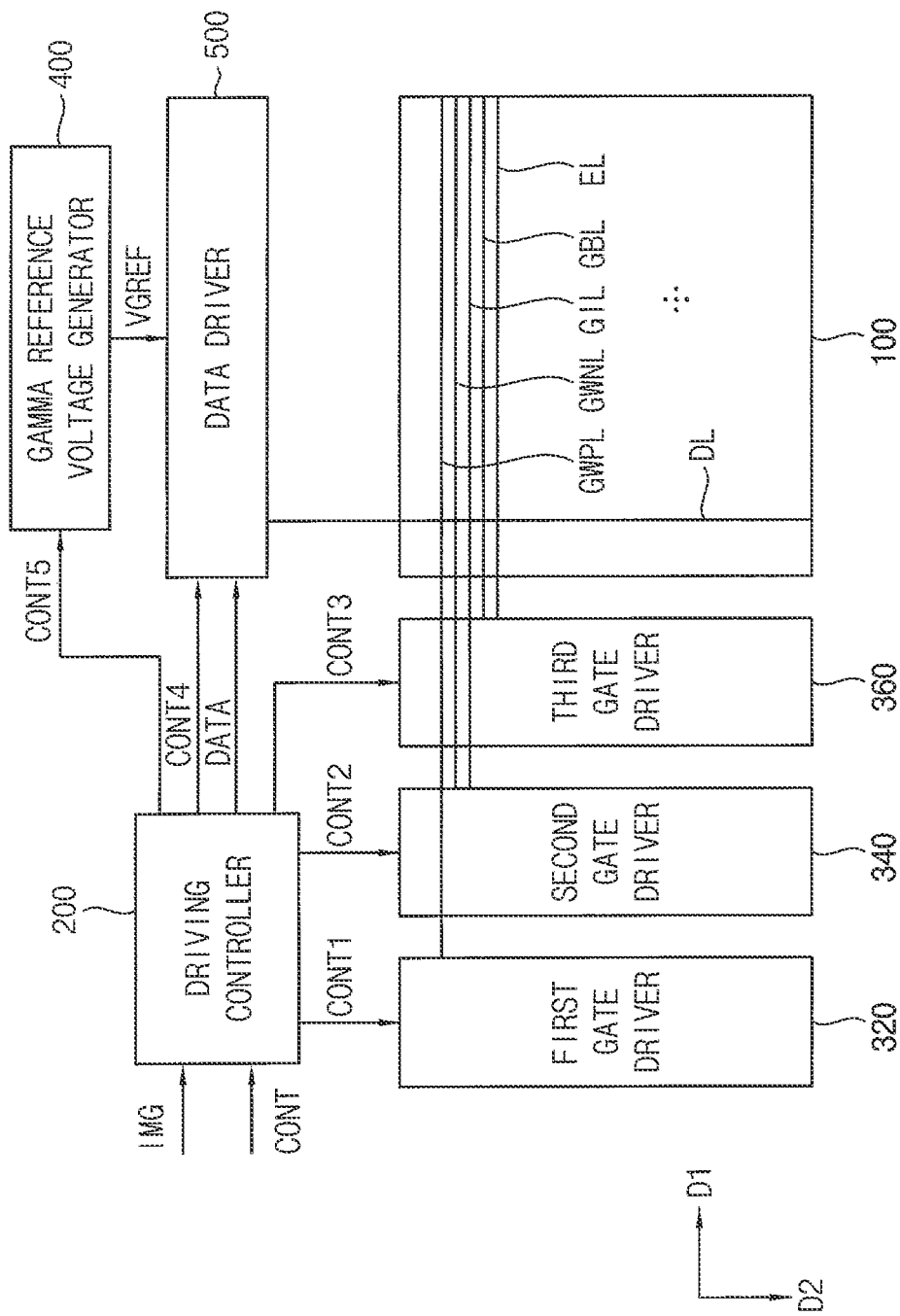
FIG. 1 is a block diagram illustrating a display apparatus according to an example embodiment of the present inventive concept.

FIG. 1 is a block diagram illustrating a display apparatus according to an example embodiment of the present inventive concept.

Referring to FIG. 1, the display apparatus includes a display panel 100 and a display panel driver. The display panel driver includes a driving controller 200, a first gate driver 320, a second gate driver 340, a third gate driver 360, a gamma reference voltage generator 400, and a data driver 500.

The display panel 100 has a display region in which an image is displayed and a peripheral region adjacent to the display region.

The display panel 100 includes a plurality of gate lines GWPL, GWNL, GIL, and GBL, a plurality of data lines DL, a plurality of emission lines EL, and a plurality of pixels electrically connected to the gate lines GWPL, GWNL, GIL, and GBL, the data lines DL, and the emission lines EL. The gate lines GWPL, GWNL, GIL, and GBL may extend in a first direction D1, the data lines DL may extend in a second direction D2 crossing the first direction D1, and the emission lines EL may extend in the first direction D1.

The driving controller 200 receives input image data IMG and an input control signal CONT from an external apparatus (not shown). For example, the input image data IMG may include red image data, green image data, and blue image data for displaying the image in the display region of the display panel 100. The input image data IMG may further include white image data. In another example, the input image data IMG may include magenta image data, cyan image data, and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4, a fifth control signal CONT5, and a data signal DATA based on the input image data IMG and the input control signal CONT.

The driving controller 200 generates the first control signal CONT1 for controlling an operation of the first gate driver 320 based on the input control signal CONT, and outputs the first control signal CONT1 to the first gate driver 320. The first control signal CONT1 may include a first vertical start signal and a first gate clock signal.

The driving controller 200 generates the second control signal CONT2 for controlling an operation of the second gate driver 340 based on the input control signal CONT, and outputs the second control signal CONT2 to the second gate driver 340. The second control signal CONT2 may include a second vertical start signal and a second gate clock signal.

The driving controller 200 generates the third control signal CONT3 for controlling an operation of the third gate driver 360 based on the input control signal CONT, and outputs the third control signal CONT3 to the third gate driver 360. The third control signal CONT3 may include a third vertical start signal and a third gate clock signal.

The driving controller 200 generates the fourth control signal CONT4 for controlling an operation of the data driver 500 based on the input control signal CONT, and outputs the fourth control signal CONT4 to the data driver 500. The fourth control signal CONT4 may include a horizontal start signal and a load signal.

The driving controller 200 generates the data signal DATA based on the input image data IMG, and outputs the data signal DATA to the data driver 500.

The driving controller 200 generates the fifth control signal CONT5 for controlling an operation of the gamma reference voltage generator 400 based on the input control signal CONT, and outputs the fifth control signal CONT5 to the gamma reference voltage generator 400.

The first gate driver 320 generates first gate signals that drive the corresponding gate lines (e.g. GWPL) according to the first control signal CONT1 that is received from the driving controller 200. The first gate driver 320 may sequentially output the first gate signals to the corresponding gate lines (e.g. GWPL).

The second gate driver 340 generates second gate signals that drive the corresponding gate lines (e.g. GWNL and GIL) according to the second control signal CONT2 that is received from the driving controller 200. The second gate driver 340 may sequentially output the second gate signals to the corresponding gate lines (e.g. GWNL and GIL).

The third gate driver 360 generates third gate signals that drive the corresponding gate lines (e.g. GBL and EL) according to the third control signal CONT3 that is received from the driving controller 200. The third gate driver 360 may sequentially output the third gate signals to the corresponding gate lines (e.g. GBL and EL).

In an example embodiment, the first gate driver 320, the second gate driver 340, and the third gate driver 360 may be integrated on the display panel 100. For example, the first gate driver 320, the second gate driver 340, and the third gate driver 360 may be mounted on the display panel 100 in the peripheral region.

The gamma reference voltage generator 400 generates a gamma reference voltage VGREF according to the fifth control signal CONT5 that is received from the driving controller 200. The gamma reference voltage generator 400 provides the gamma reference voltage VGREF to the data driver 500. The gamma reference voltage VGREF has a value that corresponds to a level of the data signal DATA.

In an example embodiment, the gamma reference voltage generator 400 may be disposed in the driving controller 200 or in the data driver 500.

The data driver 500 receives the fourth control signal CONT4 and the data signal DATA from the driving controller 200 and further receives the gamma reference voltages VGREF from the gamma reference voltage generator 400. The data driver 500 converts the data signal DATA into data voltages having an analog value based on the gamma reference voltages VGREF. The data driver 500 outputs the data voltages to the data lines DL.

Figure 2:
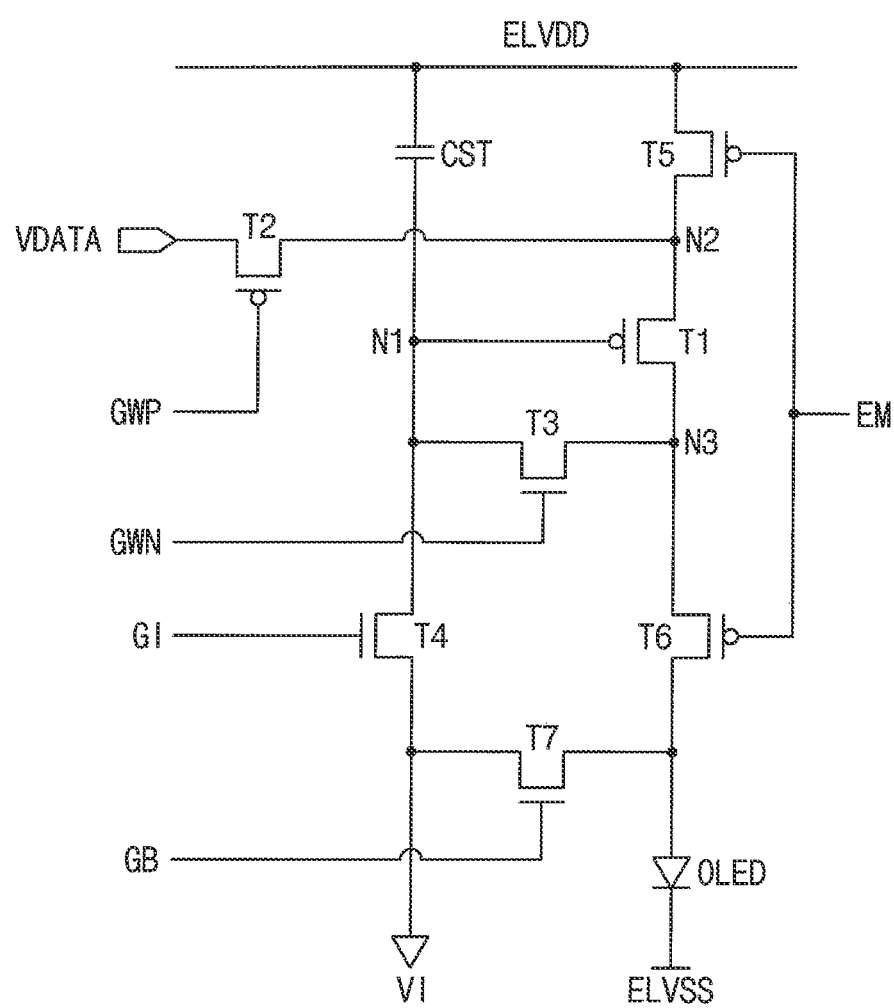
FIG. 2 is a circuit diagram illustrating a pixel of a display panel illustrated in FIG. 1.
Figure 3:
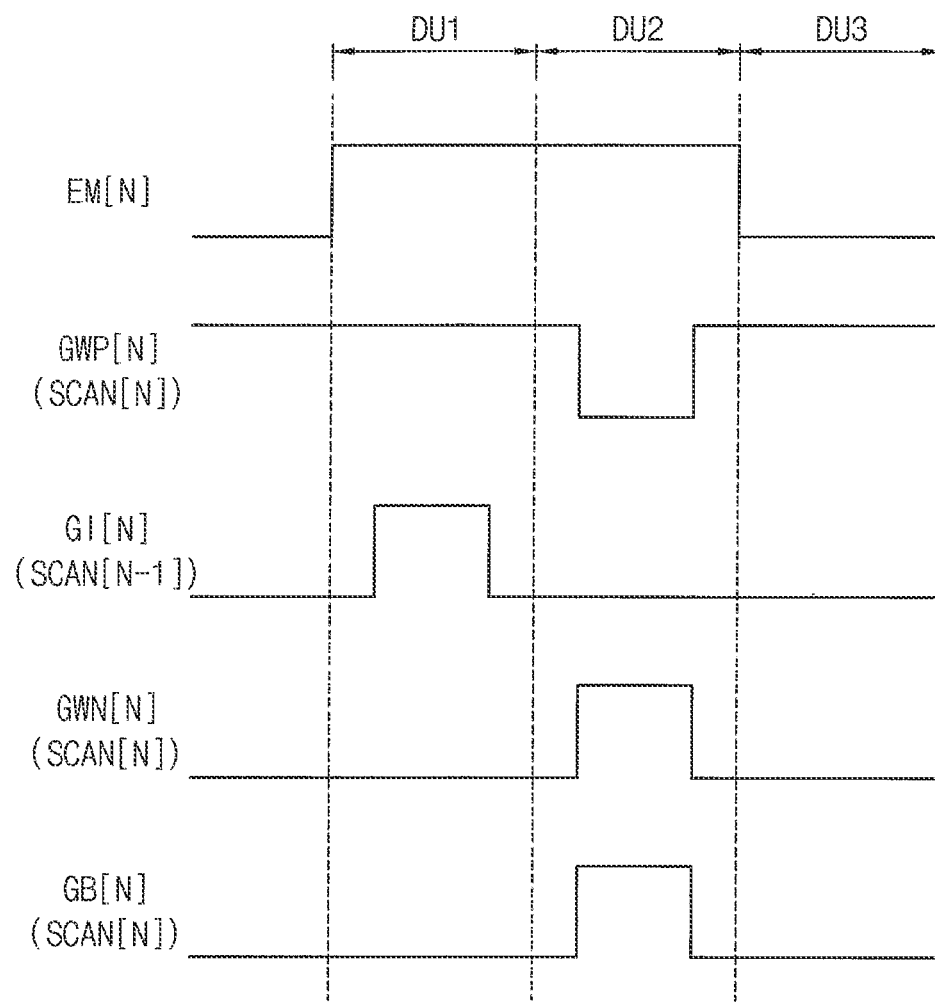
FIG. 3 is a timing diagram illustrating input signals applied to the pixel of FIG. 2.

FIG. 2 is a circuit diagram illustrating a pixel of the display panel 100 illustrated in FIG. 1. FIG. 3 is a timing diagram illustrating input signals applied to the pixel of FIG. 2.

Referring to FIGS. 1 through 3, the display panel 100 includes the plurality of the pixels. Each pixel includes an organic light emitting element OLED.

The pixel receives a first data write gate signal GWP, a second data write gate signal GWN, a data initialization gate signal GI, an organic light emitting element initialization gate signal GB, data voltage VDATA, and an emission signal EM. The organic light emitting element OLED of the pixel emits light corresponding to the level of the data voltage VDATA to display the image.

In the present example embodiment, the pixel may include a switching element of a first type and a switching element of a second type that is different from the first type. For example, the switching element of the first type may be a polysilicon thin film transistor or a low temperature polysilicon (LTPS) thin film transistor, and the switching element of the second type may be an oxide thin film transistor. In another example, the switching element of the first type may be a P-type transistor, and the switching element of the second type may be an N-type transistor.

The data write gate signals may include the first data write gate signal GWP and the second data write gate signal GWN. The first data write gate signal GWP may be applied to the P-type transistor of the pixel so that the first data write gate signal GWP has an activation signal of a low level corresponding to a data writing timing. The second data write gate signal GWN may be applied to the N-type transistor of the pixel so that the second data write gate signal GWN has an activation signal of a high level corresponding to the data writing timing. The first data write gate signal GWP may correspond to the first gate signal generated by the first gate driver 320. The second data write gate signal GWN may correspond to the second gate signal generated by the second gate driver 340.

Referring to FIG. 2, the pixel of the display panel 100 may include first to seventh pixel switching elements T1 to T7, a storage capacitor CST, and the organic light emitting element OLED.

The first pixel switching element T1 includes a control electrode connected to a first node N1, an input electrode connected to a second node N2, and an output electrode connected to a third node N3.

In one example embodiment, the first pixel switching element T1 may be a polysilicon thin film transistor. In another example embodiment, the first pixel switching element T1 may be a P-type thin film transistor.

The second pixel switching element T2 includes a control electrode to which the first data write gate signal GWP is applied, an input electrode to which the data voltage VDATA is applied, and an output electrode connected to the second node N2.

In one example embodiment, the second pixel switching element T2 may be a polysilicon thin film transistor. In another example embodiment, the second pixel switching element T2 may be a P-type thin film transistor. The first pixel switching element T1 and the second pixel switching element T2 may be of the same type or different types. For example, both of the first pixel switching element T1 and the second pixel switching element T2 may be a polysilicon thin film transistor or a P-type thin film transistor. In another example, the first pixel switching element T1 is a polysilicon thin film transistor, and the second pixel switching element T2 is a P-type thin film transistor, or vice versa.

The third pixel switching element T3 includes a control electrode to which the second data write gate signal GWN is applied, an input electrode connected to the first node N1, and an output electrode connected to the third node N3.

In one example embodiment, the third pixel switching element T3 may be n oxide thin film transistor. In another example embodiment, the third pixel switching element T3 may be an N-type thin film transistor.

The fourth pixel switching element T4 includes a control electrode to which the data initialization gate signal GI is applied, an input electrode to which an initialization voltage VI is applied, and an output electrode connected to the first node N1.

In one example embodiment, the fourth pixel switching element T4 may be an oxide thin film transistor. In another example embodiment, the fourth pixel switching element T4 may be an N-type thin film transistor.

The fifth pixel switching element T5 includes a control electrode to which the emission signal EM is applied, an input electrode to which a high power voltage ELVDD is applied, and an output electrode connected to the second node N2.

In one example embodiment, the fifth pixel switching element T5 may be a polysilicon thin film transistor. In another example embodiment, the fifth pixel switching element T5 may be a P-type thin film transistor.

The sixth pixel switching element T6 includes a control electrode to which the emission signal EM is applied, an input electrode connected to the third node N3, and an output electrode connected to an anode electrode of the organic light emitting element OLED.

In one example embodiment, the sixth pixel switching element T6 may be a polysilicon thin film transistor. In another example embodiment, the sixth pixel switching element T6 may be a P-type thin film transistor.

The seventh pixel switching element T7 includes a control electrode to which the organic light emitting element initialization gate signal GB is applied, an input electrode to which the initialization voltage VI is applied, and an output electrode connected to the anode electrode of the organic light emitting element OLED.

In one example embodiment, the seventh pixel switching element T7 may be an oxide thin film transistor. In another example embodiment, the seventh pixel switching element T7 may be an N-type thin film transistor.

The control electrodes of the first to seventh pixel switching elements T1 to T7 may be gate electrodes, the input electrodes of the first to seventh pixel switching elements T1 to T7 may be source electrodes, and the output electrodes of the first to seventh pixel switching elements T1 to T7 may be drain electrodes.

The storage capacitor CST includes a first electrode to which the high power voltage ELVDD is applied and a second electrode connected to the first node N1.

The organic light emitting element OLED includes the anode electrode and a cathode electrode to which a low power voltage ELVSS is applied.

Referring to the timing diagram of FIG. 3, during a first duration DU1, the second gate driver 340 outputs the data initialization gate signal GI having a positive pulse via the gate line GIL, the fourth pixel switching element T4 is turned on, and the first node N1 and the storage capacitor CST are initialized according to the data initialization gate signal GI. During a second duration DU2, the first gate driver 320 outputs the first data write gate signal GWP having a negative pulse via the gate line GWPL, the second gate driver 340 outputs the second data write gate signal GWN having a positive pulse via the gate line GWNL, and the third gate driver 360 outputs the organic light emitting element initialization gate signal GB having a positive pulse via the gate line GBL. In this case, the first pixel switching element T1 is diode-connected via the third pixel switching element T3 that is turned on according to the second data write gate signal GWN. Therefore, a threshold voltage |VTH| of the first pixel switching element T1 is compensated, and the data voltage VDATA of which the threshold voltage |VTH| is compensated is applied to the first node N1 according to the first and second data write gate signals GWP and GWN. In addition, during the second duration DU2, the anode electrode of the organic light emitting element OLED is initialized according to the organic light emitting element initialization gate signal GB. During a third duration DU3, the fifth and sixth pixel switching elements T5 and T6 are turned on according to the emission signal EM, the organic light emitting element OLED emits light according to the current flowing through the first pixel switching element T1, and the display panel 100 displays the image accordingly.

Although the present example has an emission-off duration of the emission signal EM during the first and second durations DU1 and DU2, the present inventive concept is not limited thereto. The emission-off duration of the emission signal EM may include the second duration DU2 during which the data voltage VDATA is applied. In some embodiments, the emission-off duration of the emission signal EM may be longer than a sum of the first and second durations DU1 and DU2.

During the first duration DU1, the data initialization gate signal GI may have an active level. For example, the active level of the data initialization gate signal GI may be a high level. When the data initialization gate signal GI having the active level is applied, the fourth pixel switching element T4 is turned on so that the initialization voltage VI may be applied to the first node N1. The data initialization gate signal GI[N] of a present stage N may be generated based on a scan signal SCAN[N−1] of a previous stage N−1.

During the second duration DU2, the first data write gate signal GWP and the second data write gate signal GWN may have an active level. For example, the active level of the first data write gate signal GWP may be a low level, and the active level of the second data write gate signal GWN may be a high level. When the first data write gate signal GWP and the second data writhe gate signal GWN having the active level are applied, the second pixel switching element T2 and the third pixel switching element T3 are turned on. In addition, the first pixel switching element T1 is turned on in response to the initialization voltage VI. The first data write gate signal GWP[N] of the present stage N may be generated based on a scan signal SCAN[N] of the present stage N. The second data write gate signal GWN[N] of the present stage N may be generated based on the scan signal SCAN[N] of the present stage N.

A voltage having an amount of the data voltage VDATA subtracted by an absolute value |VTH| of the threshold voltage of the first pixel switching element T1 may be charged at the first node N1 along a path generated by the first to third pixel switching elements T1, T2, and T3.

In addition, during the second duration DU2, the organic light emitting element initialization gate signal GB may have an active level. For example, the active level of the organic light emitting element initialization gate signal GB may be a high level. When the organic light emitting element initialization gate signal GB having the active level is applied, the seventh pixel switching element T7 is turned on so that the initialization voltage VI may be applied to the anode electrode of the organic light emitting element OLED. The organic light emitting element initialization gate signal GB [N] of the present stage N may be generated based on the scan signal SCAN[N] of the present stage N.

During the third duration DU3, the emission signal EM may have an active level. The active level of the emission signal EM may be a low level. When the emission signal EM having the active level is applied, the fifth pixel switching element T5 and the sixth pixel switching element T6 are turned on. In addition, the first pixel switching element T1 is turned on by the voltage charged at the first node N1.

A driving current flows through the fifth pixel switching element T5, the first pixel switching element T1, and the sixth pixel switching element T6, and the organic light emitting element OLED emits light according to the driving current. An intensity of the driving current may be determined by the level of the data voltage VDATA. A luminance of the organic light emitting element OLED is determined by the amount of the driving current.

In the present example embodiment, when the image displayed on the display panel 100 is a static image or the display panel 100 is operated in an always-on mode, a driving frequency of the display panel 100 may be decreased to reduce power consumption. If all of the switching elements of the pixel of the display panel 100 are polysilicon thin film transistors, a flicker may be generated due to a leakage current of the pixel switching elements in the low frequency driving mode. According to the present inventive concept, some of the pixel switching elements may be oxide thin film transistors, and others may be polysilicon thin film transistors. In the present example embodiment, the third pixel switching element T3, the fourth pixel switching element T4, and the seventh pixel switching element T7 may be oxide thin film transistors, and the first pixel switching element T1, the second pixel switching element T2, the fifth pixel switching element T5, and the sixth pixel switching element T6 may be polysilicon thin film transistors.

Figure 4:
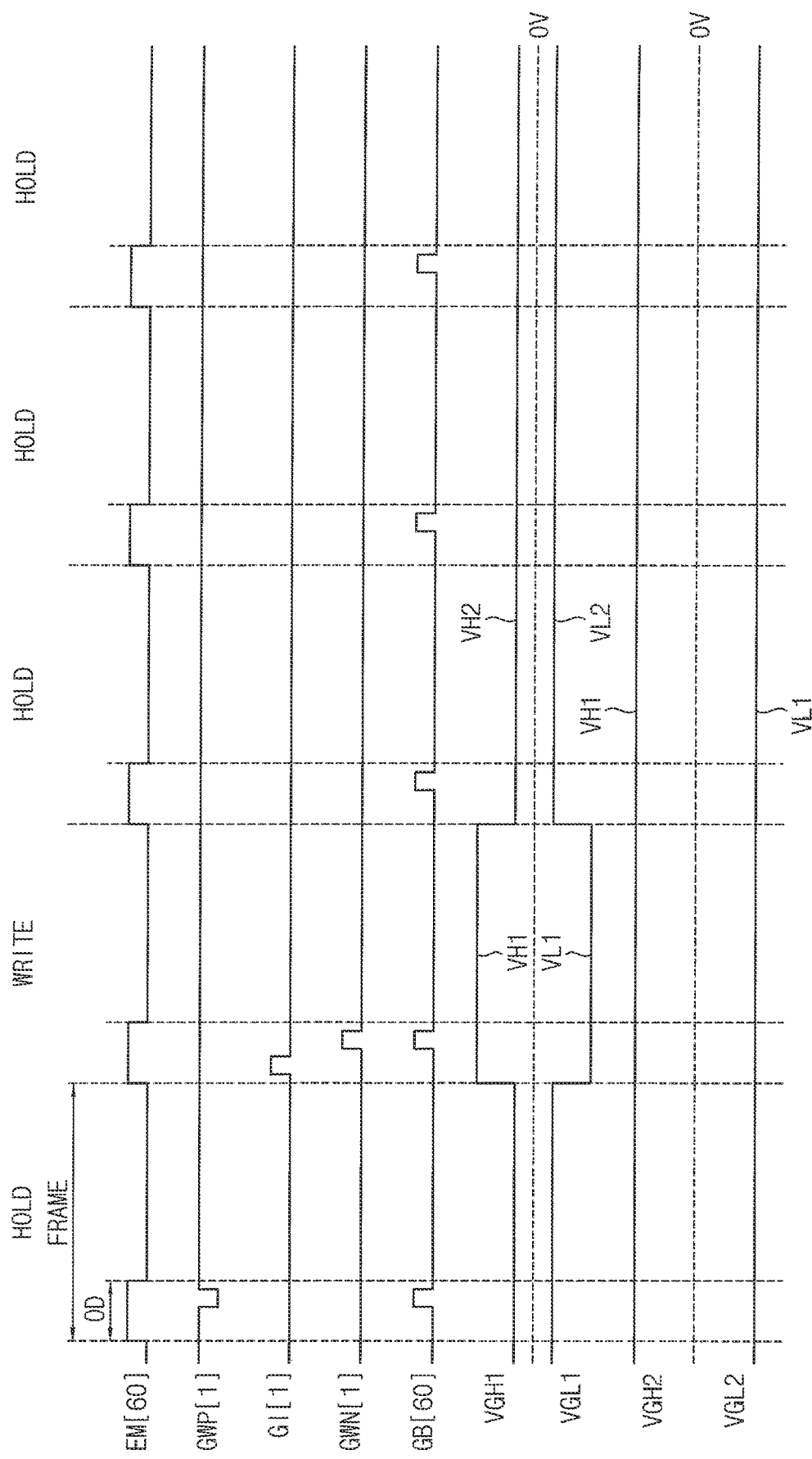
FIG. 4 is a timing diagram illustrating signals applied to the pixel of the display panel of FIG. 1 and a gate power voltage in a low frequency driving mode.

FIG. 4 is a timing diagram illustrating signals applied to the pixel of the display panel 100 of FIG. 1 and a gate power voltage in a low frequency driving mode.

Referring to FIGS. 1 through 4, the display panel 100 may be driven in a normal driving mode in which the display panel 100 is operable to be driven in a normal driving frequency and in a low frequency driving mode in which the display panel 100 is operable to be driven in a frequency lower than the normal driving frequency.

For example, when the input image data IMG represent a video image, the display panel 100 may be driven in the normal driving mode. For example, when the input image data IMG represent a static image, the display panel may be driven in the low frequency driving mode. For example, when the display apparatus is operated in the always-on mode, the display panel 100 may be driven in the low frequency driving mode.

The display panel 100 may be driven in a unit of frames. The display panel 100 may be refreshed in every frame in the normal driving mode. The normal driving mode may include only writing frames in which the input image data IMG is applied to the pixel.

The display panel 100 may be refreshed in a low frequency in the low frequency driving mode. The low frequency driving mode may include writing frames in which the input image data IMG is applied to the pixel and holding frames in which the applied data is maintained without applying the input image data IMG to the pixel.

In one example embodiment, the normal frequency of the normal driving mode is 60 Hz, and the low frequency of the low frequency driving mode is 1 Hz. In this case, the low frequency driving mode includes one writing frame WRITE and fifty nine holding frames HOLD in a second. For example, fifty nine continuous holding frames HOLD may be disposed between two adjacent writing frames WRITE.

In another example embodiment, the normal frequency of the normal driving mode is 60 Hz, and the low frequency of the low frequency driving mode is 10 Hz. In this case, the low frequency driving mode includes ten writing frame WRITE and fifty holding frames HOLD in a second. For example, five continuous holding frames HOLD may be disposed between two adjacent writing frames WRITE.

In the present example embodiment, the first data write gate signal GWP, the second data write gate signal GWN, and the data initialization gate signal GI may have a first frequency in the low frequency driving mode. The first frequency may correspond to the frequency of the low frequency driving mode. In contrast, the emission signal EM and the organic light emitting element initialization gate signal GB may have a second frequency that is greater than the first frequency in the low frequency driving mode. The second frequency may be the normal frequency of the normal driving mode. FIG. 4 illustrates an example in which the first frequency is 1 Hz, and the second frequency is 60 Hz.

The emission signal EM in a frame may include an emission-off duration OD during which the emission signal EM has an inactive level and an emission-on duration during which the emission signal EM has an active level.

At least one of the gate power voltages to generate the first data write gate signal GWP, the second data write gate signal GWN, and the emission signal EM may have different levels in the writing frame WRITE of the low frequency driving mode and in the holding frame HOLD.

In the present example embodiment, the first data write gate signal GWP and the second data write gate signal GWN may have a first frequency (e.g., 1 Hz) and the emission signal EM may have a second frequency (e.g., 60 Hz) that is greater than the first frequency.

In the present example embodiment, the first data write gate signal GWP and the second data write gate signal GWN may be generated based on first gate power voltages VGH1 and VGL1. The emission signal EM may be generated based on second gate power voltages VGH2 and VGL2.

In the writing frame WRITE of the low frequency driving mode, the first data write gate signal GWP and the second data write gate signal GWN may be generated based on a first gate high level VH1 and a first gate low level VL1. In the holding frame HOLD of the low frequency driving mode, the first data write gate signal GWP and the second data write gate signal GWN may be generated based on a second gate high level VH2 that is lower than the first gate high level VH1 and a second gate low level VL2 that is greater than the first gate low level VL1.

The first gate high level VH1 may correspond to a normal gate high level in the normal driving mode. The second gate high level VH2 may correspond to a power-reducing gate high level the normal driving mode. The first gate low level VL1 may correspond to a normal gate low level. The second gate low level VL2 may correspond to a power-reducing gate low level.

In the writing frame WRITE, the first data write gate signal GWP and the second data write gate signal GWN are output to the pixel. The first data write gate signal GWP and the second data write gate signal GWN may be generated using the first gate high level VH1 and the first gate low level VL1.

In contrast, in the holding frame HOLD, the first data write gate signal GWP and the second data write gate signal GWN may not be output to the pixel so that the high level of the gate power voltage may be decreased from the first gate high level VH1 to the second gate high level VH2, and the low level of the gate power voltage may be increased from the first gate low level VL1 to the second gate low level VL2.

The second gate high level VH2 may be lower than the first gate high level VH1 and equal to or greater than 0. The second gate low level VL2 may be greater than the first gate low level VL1 and equal to or less than 0.

In the low frequency driving mode, the emission signal EM may be generated based on a direct-current ("DC") power voltage.

For example, the emission signal EM may be generated based on the first gate high level VH1 and the first gate low level VL1 in the writing frame WRITE and in the holding frame HOLD of the low frequency driving mode.

In the present example embodiment, the first data write gate signal GWP, the second data write gate signal GWN, and the emission signal EM may have the second frequency (e.g., 60 Hz).

In the normal driving mode, the first data write gate signal GWP, the second data write gate signal GWN, and the emission signal EM may be generated based on the direct-current ("DC") power voltage.

For example, the first data write gate signal GWP, the second data write gate signal GWN, and the emission signal EM may be generated based on the first gate high level VH1 and the first gate low level VL1 in the writing frame WRITE and in the holding frame HOLD of the normal driving mode.

Figure 5:
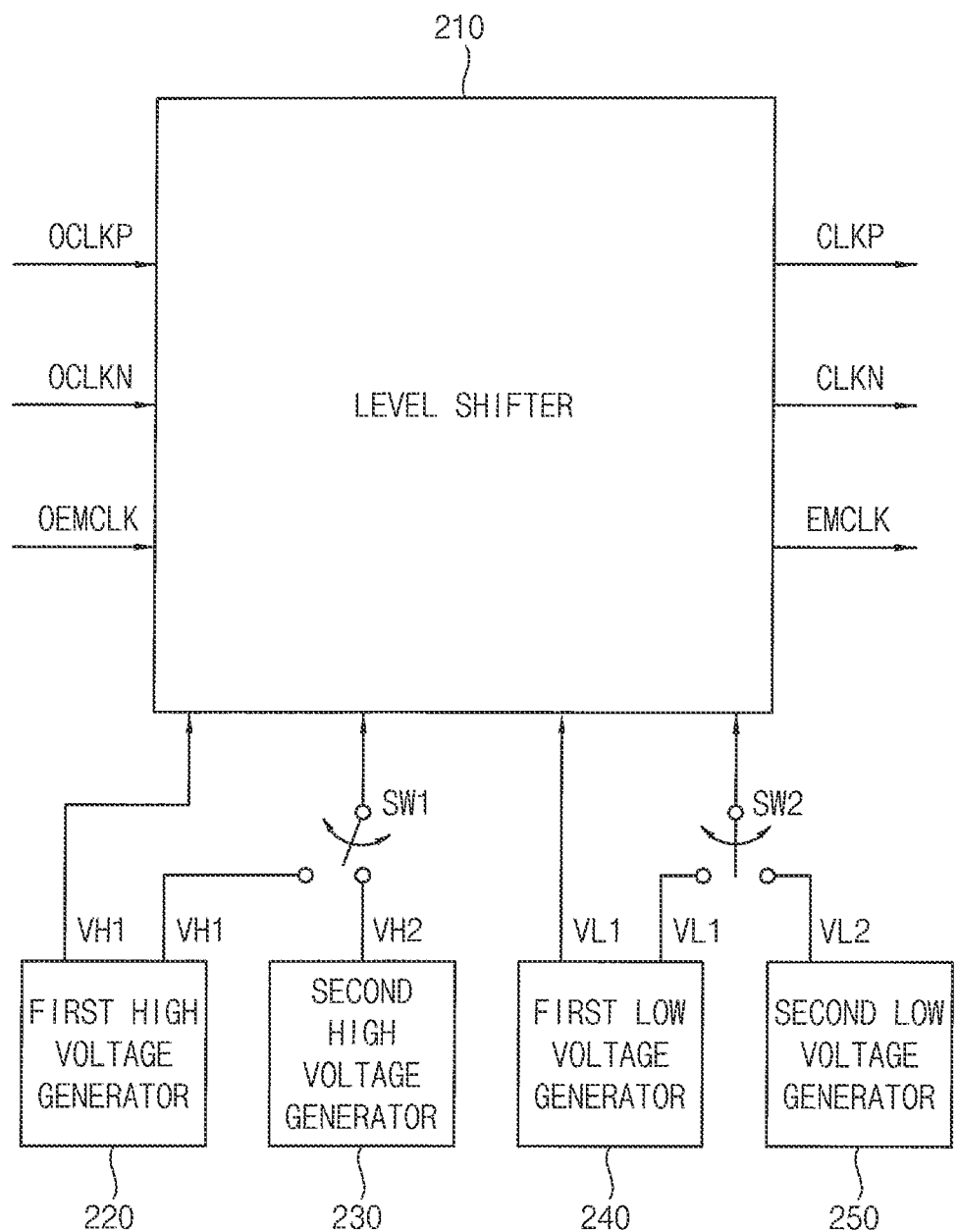
FIG. 5 is a block diagram illustrating a driving controller of FIG. 1.
Figure 6:
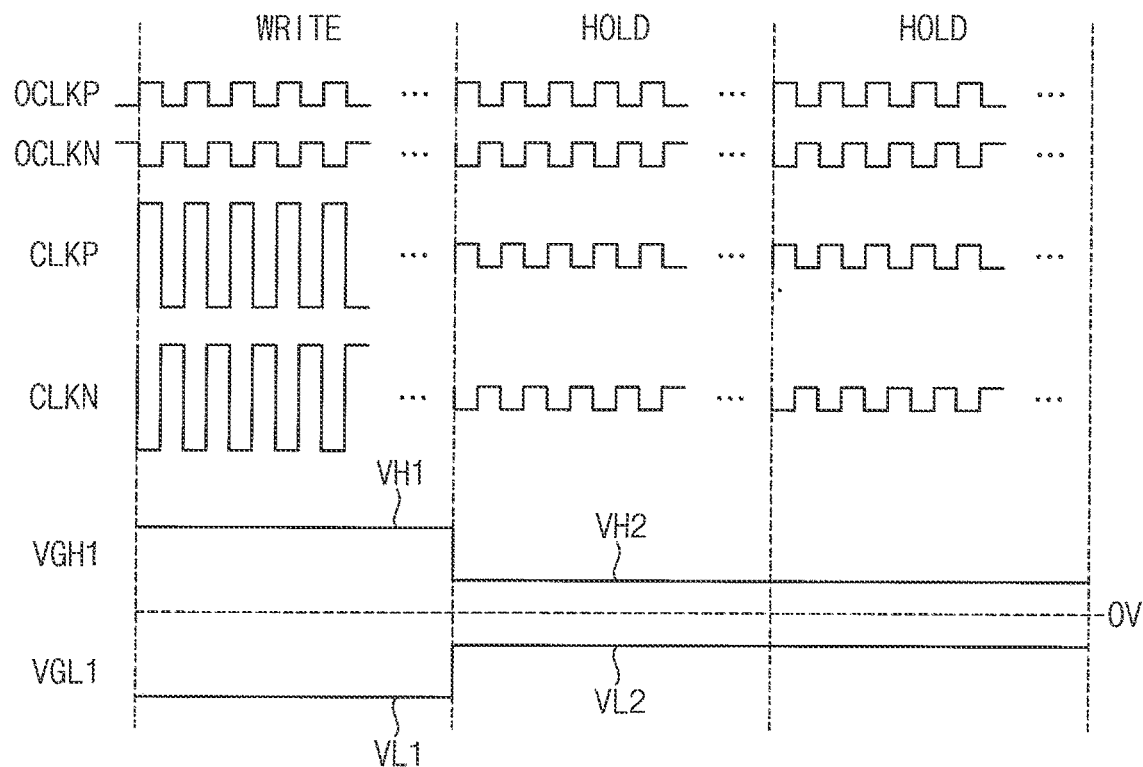
FIG. 6 is a timing diagram illustrating a first gate clock signal applied to a first gate driver of FIG. 1 and a second gate clock signal applied to a second gate driver of FIG. 1.
Figure 7:
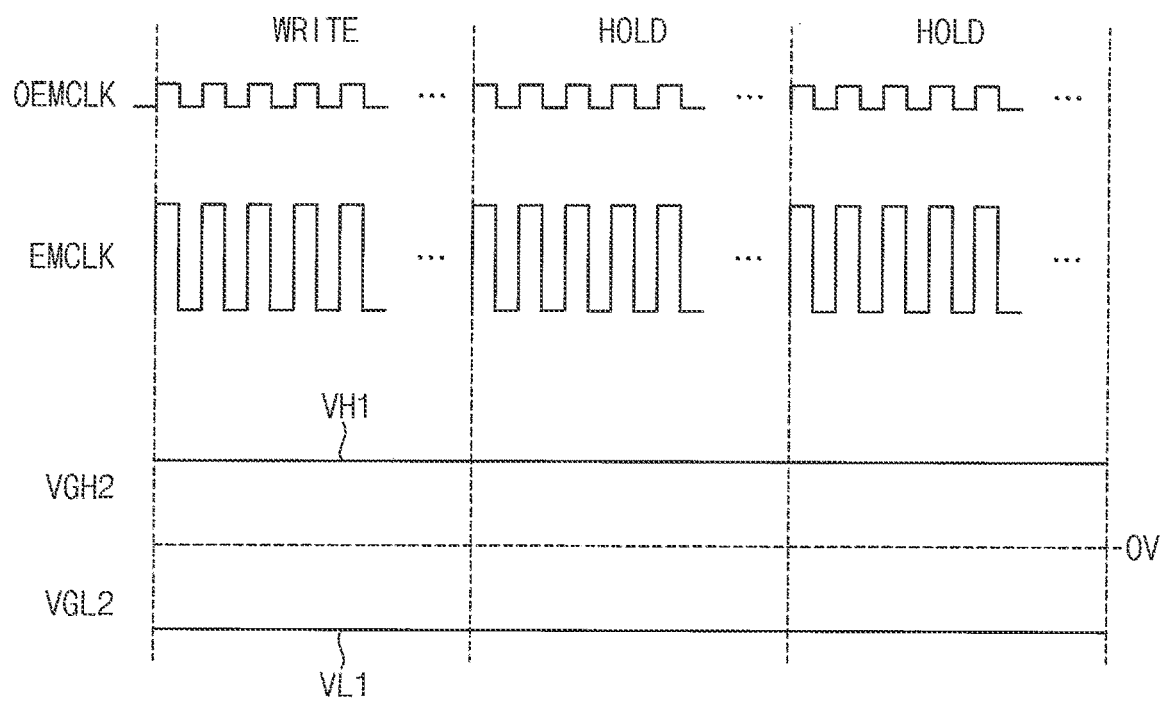
FIG. 7 is a timing diagram illustrating a third gate clock signal applied to a third gate driver of FIG. 1.

FIG. 5 is a block diagram illustrating the driving controller 200 of FIG. 1. FIG. 6 is a timing diagram illustrating a first gate clock signal CLKP applied to the first gate driver 320 of FIG. 1 and a second gate clock signal CLKN applied to the second gate driver 340 of FIG. 1. FIG. 7 is a timing diagram illustrating a third gate clock signal EMCLK applied to the third gate driver 360 of FIG. 1.

Referring to FIGS. 1 through 7, the driving controller 200 may include a level shifter 210, a first high voltage generator 220, a second high voltage generator 230, a first low voltage generator 240, and a second low voltage generator 250.

The level shifter 210 may generate the first gate clock signal CLKP, the second gate clock signal CLKN, and the third gate clock signal EMCLK based on a first native gate clock signal OCLKP, a second native gate clock signal OCLKN, a third native gate clock signal OEMCLK, the first gate power voltages VGH1 and VGL1, and the second gate power voltages VGH2 and VGL2. The level shifter 210 may respectively output the first gate clock signal CLKP, the second gate clock signal CLKN, and the third gate clock signal EMCLK to the first gate driver 320, the second gate driver 340, and the third gate driver 360.

The first gate clock signal CLKP may have a phase same as a phase of the first native gate clock signal OCLKP and have an amplitude greater than an amplitude of the first native gate clock signal OCLKP. The amplitude of the first gate clock signal CLKP may be determined by the first gate power voltages VGH1 and VGL1. The second gate clock signal CLKN may have a phase same as a phase of the second native gate clock signal OCLKN and have an amplitude greater than an amplitude of the second native gate clock signal OCLKN. The amplitude of the second gate clock signal CLKN may be determined by the first gate power voltages VGH1 and VGL1. The third gate clock signal EMCLK may have a phase same as a phase of the third native gate clock signal OEMCLK and have an amplitude greater than an amplitude of the third native gate clock signal OEMCLK. The amplitude of the third gate clock signal EMCLK may be determined by the second gate power voltages VGH2 and VGL2.

The first high voltage generator 220 may generate the first gate high level VH1. The second high voltage generator 230 may generate the second gate high level VH2 that is lower than the first gate high level VH1.

The first low voltage generator 240 may generate the first gate low level VL1. The second low voltage generator 250 may generate the second gate low level VL2 that is greater than the first gate low level VL1.

The driving controller 200 may further include a first switch SW1 that is operable to selectively transmit one of the first gate high level VH1 and the second gate high level VH2 to the level shifter 210 and a second switch SW2 that is operable to selectively transmit one of the first gate low level VL1 and the second gate low level VL2 to the level shifter 210.

The first switch SW1 and the second switch SW2 may operate a switching operation according to the normal driving mode and the low frequency driving mode. In addition, the first switch SW1 and the second switch SW2 may operate a switching operation according to whether the present frame is the writing frame WRITE or the holding frame HOLD.

For example, in the writing frame WRITE, the first switch SW1 and the second switch SW2 may output the first gate high level VH1 and the first gate low level VL1 to the level shifter 210. In the holding frame HOLD, the first switch SW1 and the second switch SW2 may output the second gate high level VH2 and the second gate low level VL2 to the level shifter 210.

As shown in FIG. 6, in the writing frame WRITE of the low frequency driving mode, the first gate clock signal CLKP and the second gate clock signal CLKN may be generated based on the first gate high level VH1 and the first gate low level VL1. For example, each of the first gate clock signal CLKP and the second gate clock signal CLKN may have an amplitude that is determined based on the first gate high level VH1 and the first gate low level VL1. In the holding frame HOLD of the low frequency driving mode, the first gate clock signal CLKP and the second gate clock signal CLKN may be generated based on the second gate high level VH2 and the second gate low level VL2. For example, each of the first gate clock signal CLKP and the second gate clock signal CLKN may have an amplitude that is determined based on the second gate high level VH2 and the second gate low level VL2.

The first gate driver 320 may generate the first data write gate signal GWP using the first gate clock signal CLKP. The second gate driver 340 may generate the second data write gate signal GWN using the second gate clock signal CLKN.

As shown in FIG. 7, in the writing frame WRITE and the holding frame HOLD of the low frequency driving mode, the third gate clock signal EMCLK may be generated based on the first gate high level VH1 and the first gate low level VL1. For example, the third gate clock signal EMCLK may have an amplitude that is determined based on the first gate high level VH1 and the first gate low level VL1.

The third gate driver 360 may generate the emission signal EM using the third gate clock signal EMCLK.

According to the present example embodiment, the driving frequency of the display panel 100 may be determined according to the input image data IMG received by the driving controller 200 to reduce the power consumption of the display apparatus. In addition, the high level VGH1 of the first gate power voltage is decreased, and the low level VGL1 of the first gate power voltage is increased in the holding frame HOLD of the low frequency driving mode to further reduce the power consumption of the display apparatus. At least one of the gate power voltages to generate the first data write gate signal GWP applied to the switching element of the first type, the second data write gate signal GWN applied to the switching element of the second type and the emission signal EM may be differentiated to enhance the efficiency of the power consumption reduction.

Figure 8:
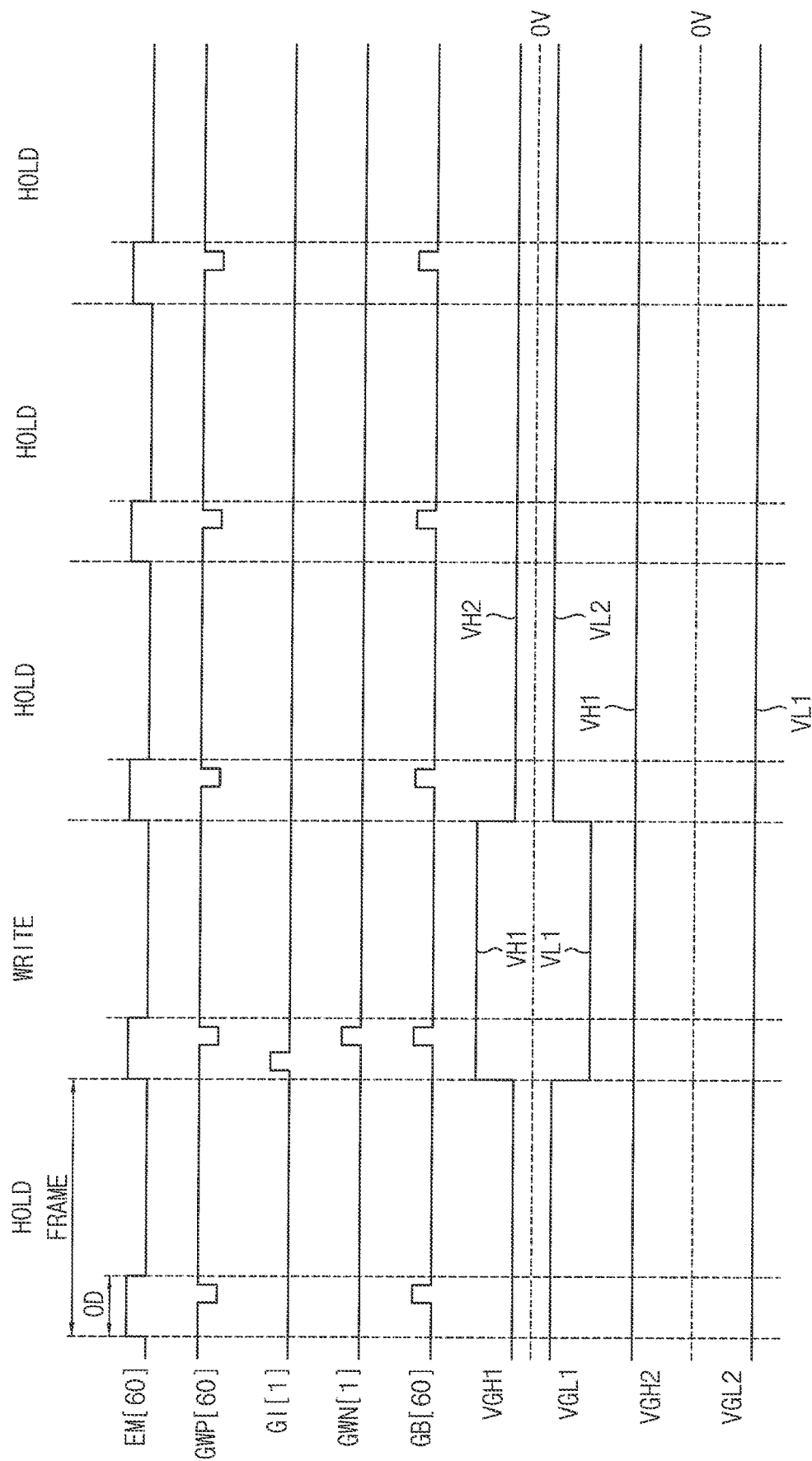
FIG. 8 is a timing diagram illustrating signals applied to a pixel of a display panel and a gate power voltage in a low frequency driving mode according to an example embodiment of the present inventive concept.
Figure 9:
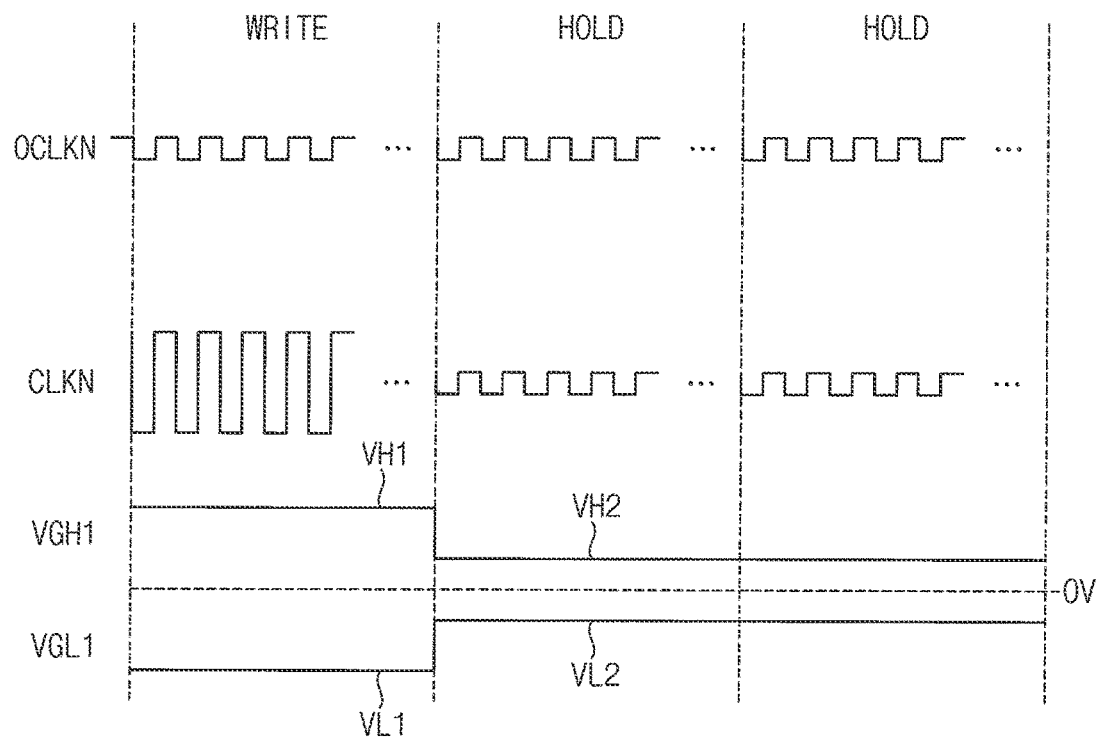
FIG. 9 is a timing diagram illustrating a second gate clock signal applied to a second gate driver of a display apparatus of FIG. 8.
Figure 10:
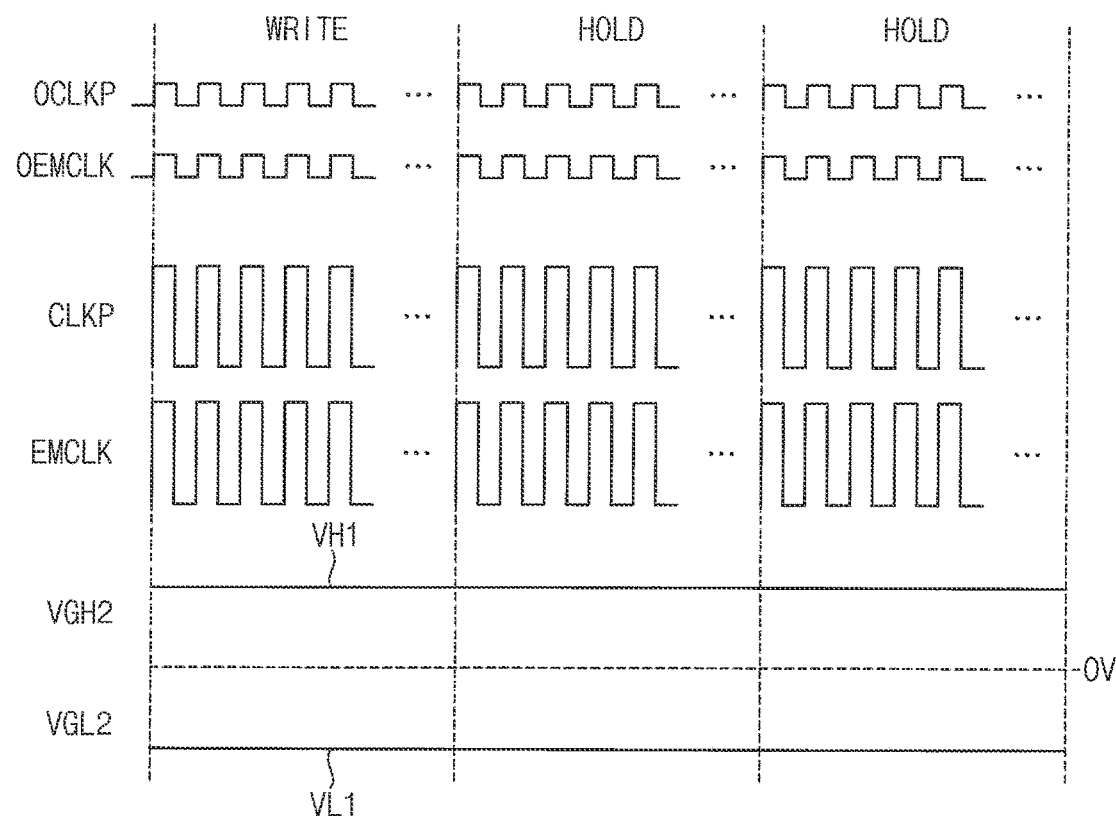
FIG. 10 is a timing diagram illustrating a first gate clock signal applied to a first gate driver of the display apparatus of FIG. 8 and a third gate clock signal applied to a third gate driver of the display apparatus of FIG. 8.

FIG. 8 is a timing diagram illustrating signals applied to a pixel of the display panel 100 and a gate power voltage in a low frequency driving mode according to an example embodiment of the present inventive concept. FIG. 9 is a timing diagram illustrating the second gate clock signal CLKN applied to the second gate driver 340 of the display apparatus. FIG. 10 is a timing diagram illustrating the first gate clock signal CLKP applied to the first gate driver 320 of the display apparatus and the third gate clock signal EMCLK applied to the third gate driver 360 of the display apparatus.

The display apparatus and the method of driving the display panel according to the present example embodiment is substantially the same as the display apparatus and the method of driving the display panel of the previous example embodiment described with reference to FIGS. 1 through 7 except for the waveform of the first gate signals. Thus, the same reference numerals will be used to refer to the same or like parts as those described in the previous example embodiment of FIGS. 1 through 7, and any repetitive explanation concerning the above elements will be omitted.

Referring to FIGS. 1 through 3, FIG. 5, and FIGS. 8 through 10, the display apparatus includes the display panel 100 and the display panel driver. The display panel driver includes the driving controller 200, the first gate driver 320, the second gate driver 340, the third gate driver 360, the gamma reference voltage generator 400, and the data driver 500.

At least one of the gate power voltages to generate the first data write gate signal GWP, the second data write gate signal GWN, and the emission signal EM may have different levels in the writing frame WRITE of the low frequency driving mode and in the holding frame HOLD.

In the present example embodiment, the second data write gate signal GWN may have a first frequency (e.g., 1 Hz) and the first data write gate signal GWP and the emission signal EM may have a second frequency (e.g., 60 Hz) that is greater than the first frequency.

In the present example embodiment, the second data write gate signal GWN may be generated based on the first gate power voltages VGH1 and VGL1. The first data write gate signal GWP and the emission signal EM may be generated based on the second gate power voltages VGH2 and VGL2.

In the writing frame WRITE of the low frequency driving mode, the second data write gate signal GWN may be generated based on the first gate high level VH1 and the first gate low level VL1. In the holding frame HOLD of the low frequency driving mode, the second data write gate signal GWN may be generated based on a second gate high level VH2 that is lower than the first gate high level VH1 and a second gate low level VL2 that is greater than the first gate low level VL1.

In the low frequency driving mode, the first data write gate signal GWP and the emission signal EM may be generated based on a direct-current ("DC") power voltage.

For example, the first data write gate signal GWP and the emission signal EM may be generated based on the first gate high level VH1 and the first gate low level VL1 in the writing frame WRITE and in the holding frame HOLD of the low frequency driving mode.

As shown in FIG. 9, in the writing frame WRITE of the low frequency driving mode, the second gate clock signal CLKN may be generated based on the first gate high level VH1 and the first gate low level VL1. In the holding frame HOLD of the low frequency driving mode, the second gate clock signal CLKN may be generated based on the second gate high level VH2 and the second gate low level VL2.

The second gate driver 340 may generate the second data write gate signal GWN using the second gate clock signal CLKN.

As shown in FIG. 10, in the writing frame WRITE and the holding frame HOLD of the low frequency driving mode, the first gate clock signal CLKP and the third gate clock signal EMCLK may be generated based on the first gate high level VH1 and the first gate low level VL1.

The first gate driver 320 and the third gate driver 360 may respectively generate the first gate clock signal CLKP and the emission signal EM using the first gate clock signal CLKP and the third gate clock signal EMCLK.

According to the present example embodiment, the driving frequency of the display panel 100 is determined according to the input image data IMG received by the driving controller 200 to reduce the power consumption of the display apparatus. In addition, the high level VGH1 of the first gate power voltage is decreased, and the low level VGL1 of the first gate power voltage is increased in the holding frame HOLD of the low frequency driving mode to further reduce the power consumption of the display apparatus. At least one of the gate power voltages to generate the first data write gate signal GWP applied to the switching element of the first type, the second data write gate signal GWN applied to the switching element of the second type and the emission signal EM may be differentiated to enhance the efficiency of the power consumption reduction.

Figure 11:
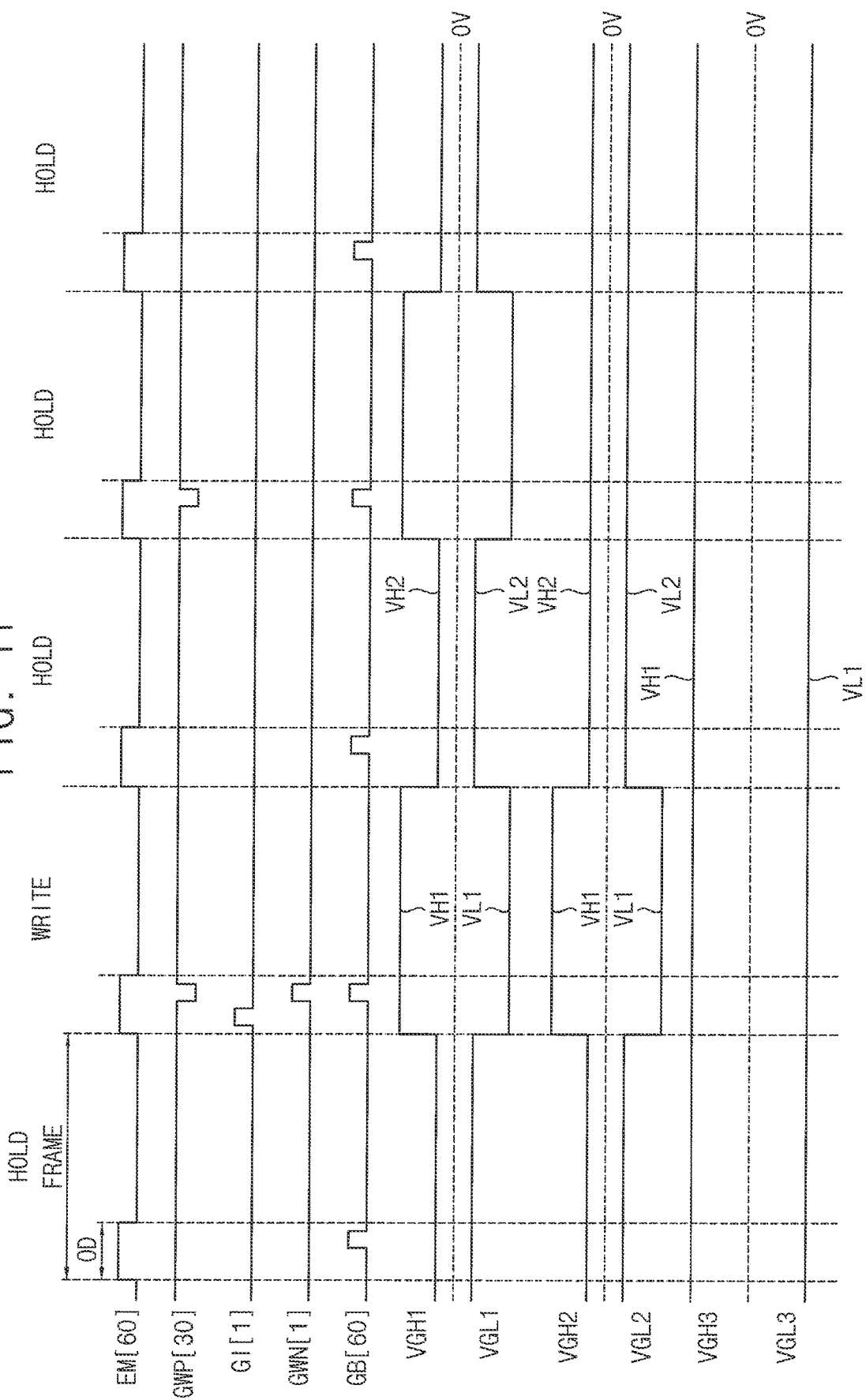
FIG. 11 is a timing diagram illustrating signals applied to pixels of a display panel and a gate power voltage in a low frequency driving mode according to an example embodiment of the present inventive concept.
Figure 12:
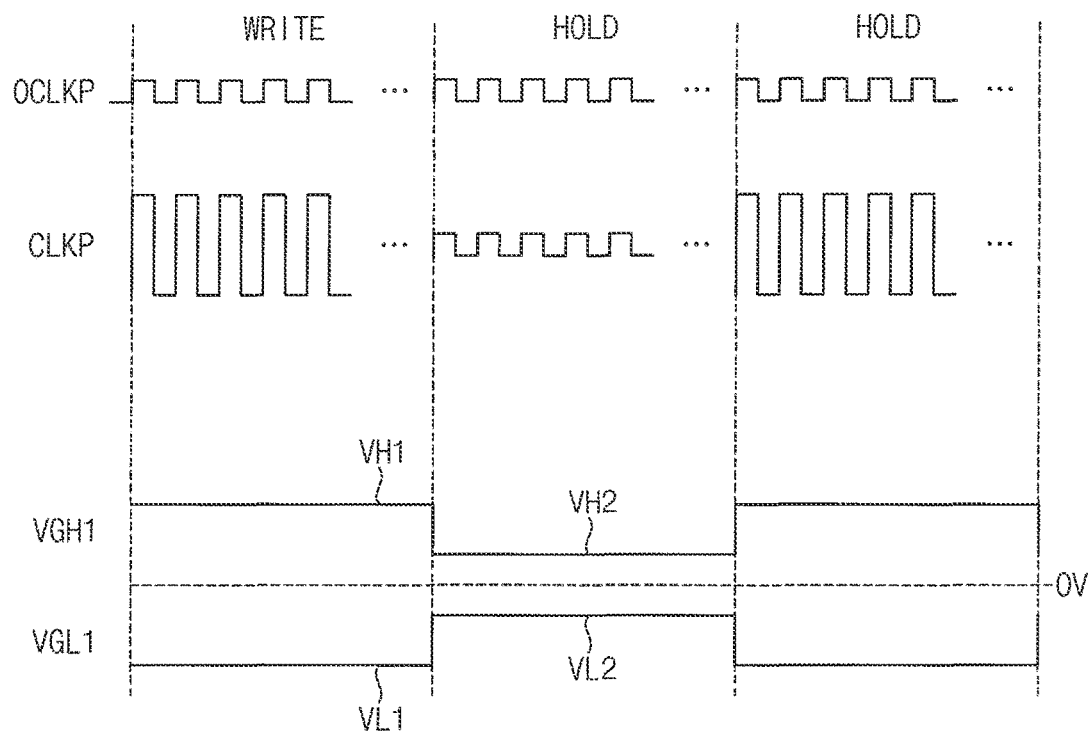
FIG. 12 is a timing diagram illustrating a first gate clock signal applied to a first gate driver of a display apparatus of FIG. 11.
Figure 13:
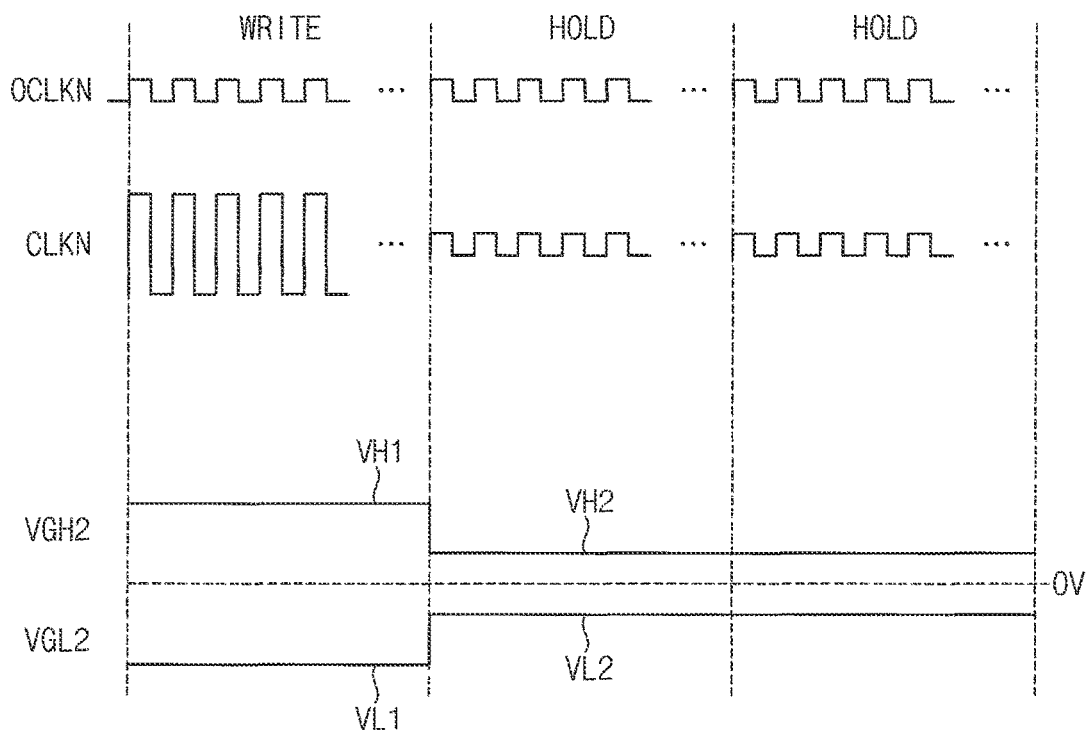
FIG. 13 is a timing diagram illustrating a second gate clock signal applied to a second gate driver of a display apparatus of FIG. 11.
Figure 14:
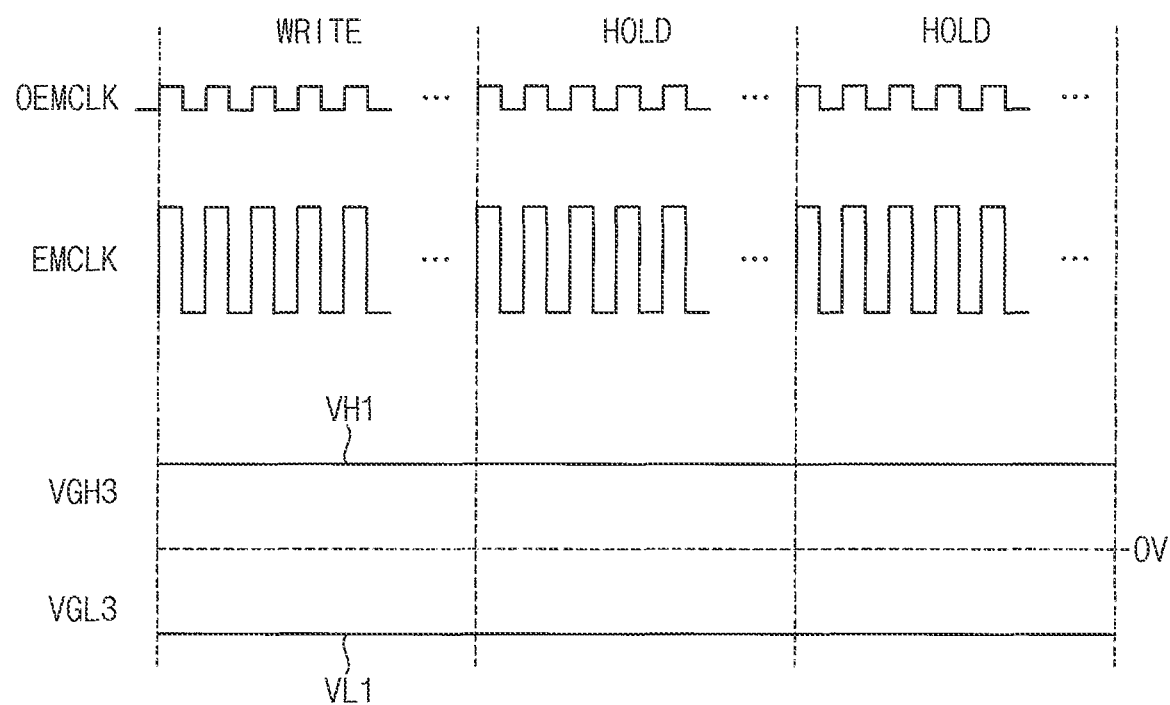
FIG. 14 is a timing diagram illustrating a third gate clock signal applied to a third gate driver of a display apparatus of FIG. 11.

FIG. 11 is a timing diagram illustrating signals applied to pixels of the display panel 100 and a gate power voltage in a low frequency driving mode according to an example embodiment of the present inventive concept. FIG. 12 is a timing diagram illustrating the first gate clock signal CLKP applied to the first gate driver 320 of a display apparatus. FIG. 13 is a timing diagram illustrating the second gate clock signal CLKN applied to the second gate driver 340 of the display apparatus. FIG. 14 is a timing diagram illustrating the third gate clock signal EMCLK applied to the third gate driver 360 of the display apparatus.

The display apparatus and the method of driving the display panel according to the present example embodiment is substantially the same as the display apparatus and the method of driving the display panel of the previous example embodiment described with reference to FIGS. 1 through 7 except for the waveforms of the first to third gate signals. Thus, the same reference numerals will be used to refer to the same or like parts as those described in the previous example embodiment of FIGS. 1 through 7, and any repetitive explanation concerning the above elements will be omitted.

Referring to FIGS. 1 through 3, FIG. 5, and FIGS. 11 through 14, the display apparatus includes the display panel 100 and a display panel driver. The display panel driver includes the driving controller 200, the first gate driver 320, the second gate driver 340, the third gate driver 360, the gamma reference voltage generator 400, and the data driver 500.

At least one of the gate power voltages to generate the first data write gate signal GWP, the second data write gate signal GWN and the emission signal EM may have different levels in the writing frame WRITE of the low frequency driving mode and in the holding frame HOLD.

In the present example embodiment, the first data write gate signal GWP, the second data write gate signal GWN, and the emission signal EM may have different frequencies from one another. Thus, the first data write gate signal GWP, the second data write gate signal GWN, and the emission signal EM may be generated based different gate power voltages from one another.

For example, the first data write gate signal GWP may have a first frequency (e.g., 30 Hz), the second data write gate signal GWN may have a second frequency (e.g., 1 Hz), and the emission signal EM may have a third frequency (e.g., 60 Hz) that is greater than the first frequency and the second frequency.

In the present example embodiment, the first data write gate signal GWP may be generated based on the first gate power voltages VGH1 and VGL1. The second data write gate signal GWN may be generated based on the second gate power voltages VGH2 and VGL2. The emission signal EM may be generated based on third gate power voltages VGH3 and VGL3.

In the writing frame WRITE of the low frequency driving mode, the first data write gate signal GWP may be generated based on the first gate high level VH1 and the first gate low level VL1. In at least one of the holding frames (e.g. a holding frame HOLD right after a write frame WRITE) in the low frequency driving mode, the first data write gate signal GWP may be generated based on a second gate high level VH2 that is lower than the first gate high level VH1 and a second gate low level VL2 that is greater than the first gate low level VL1. In addition, in at least one of the holding frames (e.g. a holding frame HOLD that is the second frame after a write frame WRITE) in the low frequency driving mode, the first data write gate signal GWP may be generated based on the first gate high level VH1 and the first gate low level VL1.

In the writing frame WRITE of the low frequency driving mode, the second data write gate signal GWN may be generated based on the first gate high level VH1 and the first gate low level VL1. In the holding frame HOLD of the low frequency driving mode, the second data write gate signal GWN may be generated based on the second gate high level VH2 that is lower than the first gate high level VH1 and the second gate low level VL2 that is greater than the first gate low level VL1.

In the low frequency driving mode, the emission signal EM may be generated based on a direct-current ("DC") power voltage.

For example, the emission signal EM may be generated based on the first gate high level VH1 and the first gate low level VL1 in the writing frame WRITE and in the holding frame HOLD of the low frequency driving mode.

As shown in FIG. 12, in the writing frame WRITE of the low frequency driving mode, the first gate clock signal CLKP may be generated based on the first gate high level VH1 and the first gate low level VL1. In at least one of the holding frames (e.g. a holding frame HOLD right after a write frame WRITE) in the low frequency driving mode, the first gate clock signal CLKP may be generated based on the second gate high level VH2 and the second gate low level VL2.

The first gate driver 320 may generate the first data write gate signal GWP using the first gate clock signal CLKP.

As shown in FIG. 13, in the writing frame WRITE of the low frequency driving mode, the second gate clock signal CLKN may be generated based on the first gate high level VH1 and the first gate low level VL1. In the holding frame HOLD of the low frequency driving mode, the second gate clock signal CLKN may be generated based on the second gate high level VH2 and the second gate low level VL2.

The second gate driver 340 may generate the second data write gate signal GWN using the second gate clock signal CLKN.

As shown in FIG. 14, in the writing frame WRITE and the holding frame HOLD of the low frequency driving mode, the third gate clock signal EMCLK may be generated based on the first gate high level VH1 and the first gate low level VL1.

The third gate driver 360 may generate the emission signal EM using the third gate clock signal EMCLK.

According to the present example embodiment, the driving frequency of the display panel 100 is determined according to the input image data IMG received by the driving controller 200 to reduce the power consumption of the display apparatus. In addition, the high level VGH1 of the first gate power voltage is decreased, and the low level VGL1 of the first gate power voltage is increased in the holding frame HOLD of the low frequency driving mode so that the power consumption of the display apparatus may further reduced. At least one of the gate power voltages to generate the first data write gate signal GWP applied to the switching element of the first type, the second data write gate signal GWN applied to the switching element of the second type and the emission signal EM may be differentiated to enhance the efficiency of the power consumption reduction.

Figure 15:
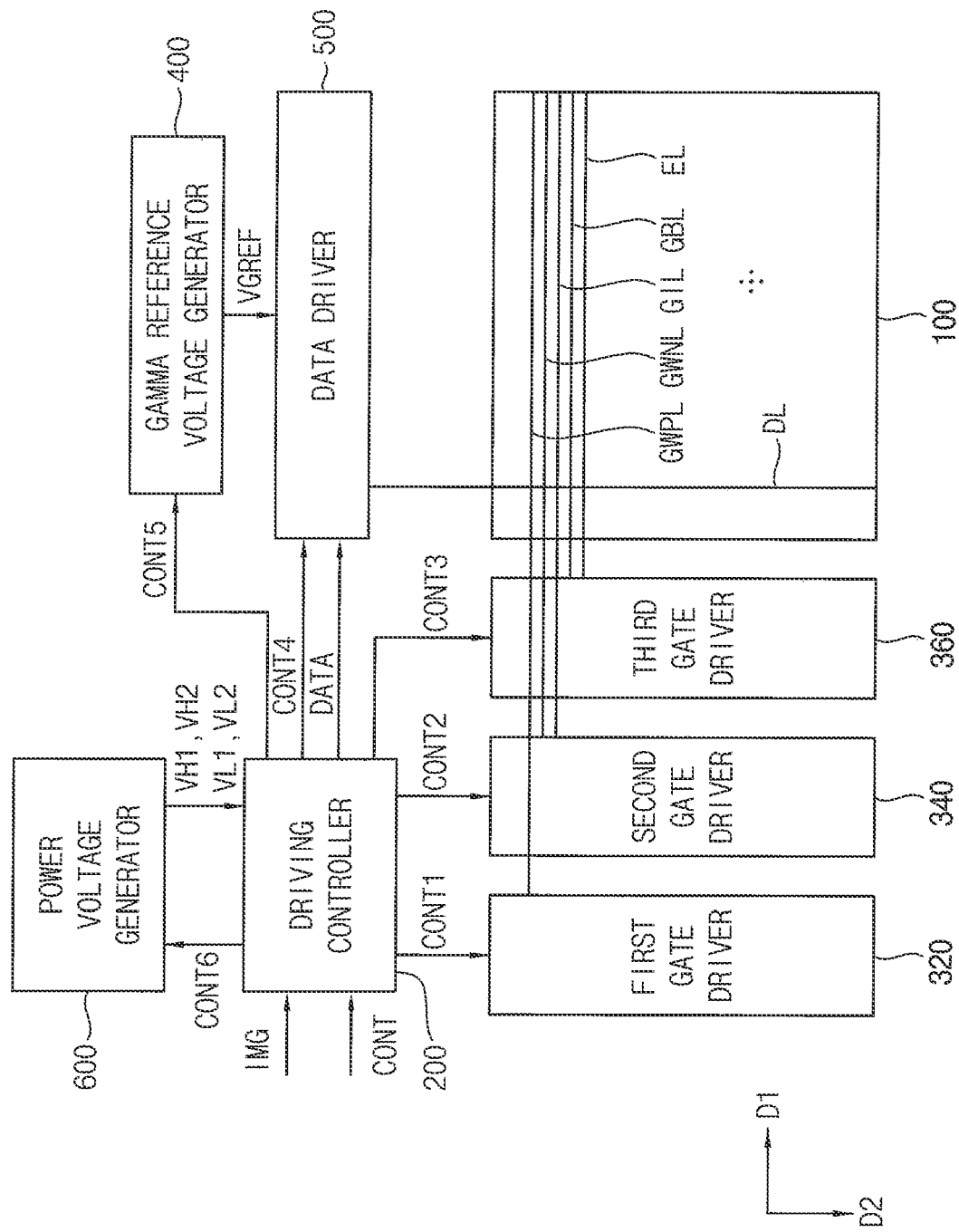
FIG. 15 is a block diagram illustrating a display apparatus according to an example embodiment of the present inventive concept.
Figure 16:
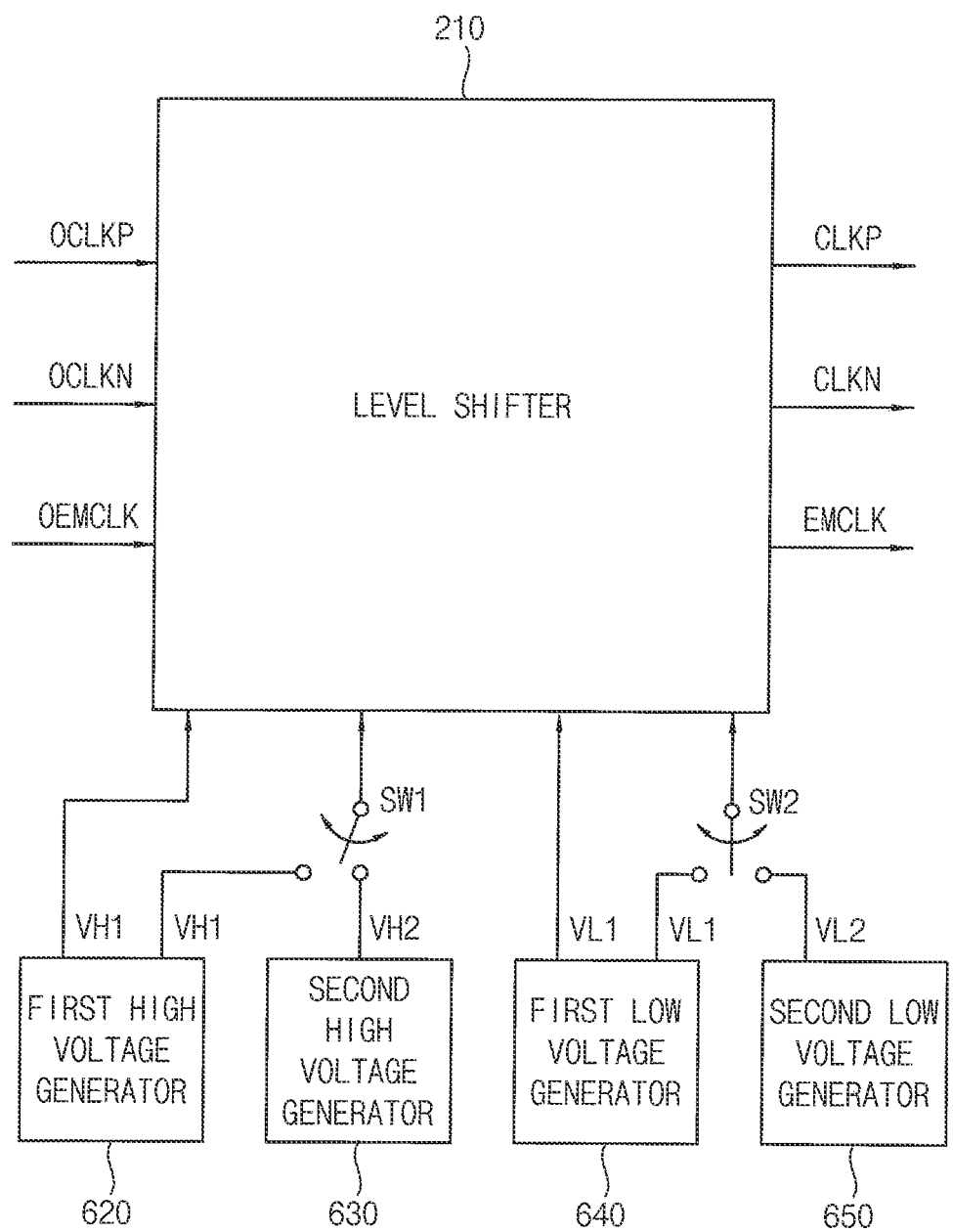
FIG. 16 is a block diagram illustrating a driving controller and a power voltage generator of FIG. 15.

FIG. 15 is a block diagram illustrating a display apparatus according to an example embodiment of the present inventive concept. FIG. 16 is a block diagram illustrating the driving controller 200 and a power voltage generator 600 of FIG. 15.

The display apparatus and the method of driving the display panel according to the present example embodiment is substantially the same as the display apparatus and the method of driving the display panel of the previous example embodiment described with reference to FIGS. 1 through 7 except for the driving controller 200 and the power voltage generator 600. Thus, the same reference numerals will be used to refer to the same or like parts as those described in the previous example embodiment of FIGS. 1 through 7, and any repetitive explanation concerning the above elements will be omitted.

Referring to FIGS. 2 through 4, FIG. 6, FIG. 7, FIG. 15, and FIG. 16, the display apparatus includes the display panel 100 and the display panel driver. The display panel driver includes the driving controller 200, the first gate driver 320, the second gate driver 340, the third gate driver 360, the gamma reference voltage generator 400, and the data driver 500. The display apparatus may further include the power voltage generator 600.

At least one of the gate power voltages to generate the first data write gate signal GWP, the second data write gate signal GWN, and the emission signal EM may have different levels in the writing frame WRITE of the low frequency driving mode and in the holding frame HOLD.

The driving controller 200 may include the level shifter 210. The power voltage generator 600 may include a first high voltage generator 620, a second high power voltage 630, a first low voltage generator 640, and a second low voltage generator 650.

The level shifter 210 may generate the first gate clock signal CLKP, the second gate clock signal CLKN, and the third gate clock signal EMCLK based on the first native gate signal OCLKP, the second native gate signal OCLKN, the third native gate signal OEMCLK, the first gate power voltages VGH1 and VGL1, and the second gate power voltages VGH2 and VGL2. The level shifter 210 may respectively output the first gate clock signal CLKP, the second gate clock signal CLKN, and the third gate clock signal EMCLK to the first gate driver 320, the second gate driver 340, and the third gate driver 360.

The first gate clock signal CLKP may have a phase same as a phase of the first native gate clock signal OCLKP and have an amplitude greater than an amplitude of the first native gate clock signal OCLKP. The second gate clock signal CLKN may have a phase same as a phase of the second native gate clock signal OCLKN and have an amplitude greater than an amplitude of the second native gate clock signal OCLKN. The third gate clock signal EMCLK may have a phase same as a phase of the third native gate clock signal OEMCLK and have an amplitude greater than an amplitude of the third native gate clock signal OEMCLK.

The first high voltage generator 620 may generate the first gate high level VH1. The second high voltage generator 630 may generate the second gate high level VH2 that is lower than the first gate high level VH1.

The first low voltage generator 640 may generate the first gate low level VL1. The second low voltage generator 650 may generate the second gate low level VL2 that is greater than the first gate low level VL1.

The driving controller 200 may further include the first switch SW1 that is operable to selectively transmit one of the first gate high level VH1 and the second gate high level VH2 to the level shifter 210 and the second switch SW2 that is operable to selectively transmit one of the first gate low level VL1 and the second gate low level VL2 to the level shifter 210.

According to the present example embodiment, the driving frequency of the display panel 100 is determined according to the input image data IMG received by the driving controller 200 to reduce the power consumption of the display apparatus. In addition, the high level VGH1 of the first gate power voltage is decreased, and the low level VGL1 of the first gate power voltage is increased in the holding frame HOLD of the low frequency driving mode to further reduce the power consumption of the display apparatus. At least one of the gate power voltages to generate the first data write gate signal GWP applied to the switching element of the first type, the second data write gate signal GWN applied to the switching element of the second type and the emission signal EM may be differentiated to enhance the efficiency of the power consumption reduction.

According to the present inventive concept as explained above, the power consumption of the display apparatus may be reduced by adjusting a driving frequency of the display panel.

The foregoing is illustrative of the present inventive concept and is not to be construed as limiting thereof. Although some example embodiments of the present inventive concept have been described, those skilled in the art will readily appreciate that modifications and deviations are possible in the example embodiments without materially departing from the novel teachings and advantages of the present inventive concept. Accordingly, such modifications are intended to be included within the scope of the present inventive concept. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific example embodiments disclosed herein, and that modifications and deviations to the disclosed example embodiments, as well as other example embodiments, are intended to be included within the scope of the present disclosure. The present inventive concept is defined by the following claims, with equivalents of the claims to be included therein.

What is claimed is:

1. A display apparatus comprising:
    a display panel comprising a pixel including a first switching element having a first type and connected to a first gate line, a second switching element having a second type different from the first type and connected to a second gate line and a third switching element having the first type and connected to an emission line;
    wherein at least two of a first gate signal applied to the first gate line, a second gate signal applied to the second gate line and an emission signal applied to the emission line are generated based on different gate power voltages from each other,
    wherein the display apparatus is operable in a low frequency driving mode, and the low frequency driving mode includes a writing frame and a holding frame subsequent to the writing frame,
    wherein at least one of the gate power voltages used to generate the first gate signal, the second gate signal, and the emission signal has a first voltage level in the writing frame in the low frequency driving mode and a second voltage level that is different from the first voltage level in the holding frame of the low frequency driving mode, both of the first voltage level and the second voltage level corresponding to a same gate state selected from a gate-high state and a gate low state,
    wherein a data voltage is applied to the pixel in the writing frame of the low frequency driving mode, and
    wherein the pixel emits a light in the holding frame of the low frequency driving mode according to the data voltage.

2. The display apparatus of claim 1, wherein the first gate signal is generated based on first gate power voltages,
    wherein the second gate signal is generated based on second gate power voltages different from the first gate power voltages,
    wherein the emission signal is generated based on third gate power voltages different from the first gate power voltages and the second power voltages.

3. The display apparatus of claim 1, wherein the first switching element of the first type is a polysilicon thin film transistor, and
    wherein the second switching element of the second type is an oxide thin film transistor.

4. The display apparatus of claim 1, wherein the first switching element of the first type is a p-type transistor, and
    wherein the second switching element of the second type is an n-type transistor.

5. The display apparatus of claim 1, wherein the pixel comprises:
    a light emitting element comprising an anode electrode and a cathode electrode to which a low power voltage is applied;
    a first pixel switching element comprising a first control electrode connected to a first node, a first input electrode connected to a second node, and a first output electrode connected to a third node;
    a second pixel switching element comprising a second control electrode to which the first gate signal is applied, a second input electrode to which the data voltage is applied, and a second output electrode connected to the second node;
    a third pixel switching element comprising a third control electrode to which the second gate signal is applied, a third input electrode connected to the first node, and a third output electrode connected to the third node;
    a fourth pixel switching element comprising a fourth control electrode to which a data initialization gate signal is applied, a fourth input electrode to which an initialization voltage is applied, and a fourth output electrode connected to the first node;

a fifth pixel switching element comprising a fifth control electrode to which the emission signal is applied, a fifth input electrode to which a high power voltage is applied, and a fifth output electrode connected to the second node;

a sixth pixel switching element comprising a sixth control electrode to which the emission signal is applied, a sixth input electrode connected to the third node, and a sixth output electrode connected to the anode electrode of the organic light emitting element;

a seventh pixel switching element comprising a seventh control electrode to which an organic light emitting element initialization gate signal is applied, a seventh input electrode to which the initialization voltage is applied, and a seventh output electrode connected to the anode electrode of the organic light emitting element; and a storage capacitor comprising a first electrode to which the high power voltage is applied and a second electrode connected to the first node.

6. The display apparatus of claim 5, wherein the first pixel switching element, the second pixel switching element, the fifth pixel switching element, and the sixth pixel switching element are polysilicon thin film transistors, and wherein the third pixel switching element, the fourth pixel switching element, and the seventh pixel switching element are oxide thin film transistors.

7. The display apparatus of claim 5, wherein the first switching element is the second pixel switching element, wherein the second switching element is the third pixel switching element, and wherein the third switching element is the sixth pixel switching element.

8. The display apparatus of claim 1, wherein the first gate signal and the second gate signal have a first frequency in the low frequency driving mode, and wherein the emission signal has a second frequency that is greater than the first frequency in the low frequency driving mode.

9. The display apparatus of claim 8, wherein the first gate signal and the second gate signal are generated based on a first gate high voltage level and a first gate low voltage level in the writing frame of the low frequency driving mode, and wherein the first gate signal and the second gate signal are generated based on a second gate high voltage level that is lower than the first gate high voltage level and a second gate low voltage level that is greater than the first gate low voltage level in the holding frame of the low frequency driving mode.

10. The display apparatus of claim 9, wherein the emission signal is generated based on a direct-current ("DC") voltage in the low frequency driving mode.

11. The display apparatus of claim 10, wherein the emission signal is generated based on the first gate high voltage level and the first gate low voltage level in the writing frame of the low frequency driving mode and in the holding frame of the low frequency driving mode.

12. The display apparatus of claim 1, wherein the second gate signal has a first frequency in the low frequency driving mode, and wherein the first gate signal and the emission signal have a second frequency that is greater than the first frequency in the low frequency driving mode.

13. The display apparatus of claim 12, wherein the second gate signal is generated based on a first gate high voltage level and a first gate low voltage level in the writing frame of the low frequency driving mode, and wherein the second gate signal is generated based on a second gate high voltage level that is lower than the first gate high voltage level and a second gate low voltage level that is greater than the first gate low voltage level in the holding frame of the low frequency driving mode.

14. The display apparatus of claim 13, wherein the first gate signal and the emission signal are generated based on a direct-current ("DC") voltage in the low frequency driving mode.

15. The display apparatus of claim 14, wherein the first gate signal and the emission signal are generated based on the first gate high voltage level and the first gate low voltage level in the writing frame of the low frequency driving mode and in the holding frame of the low frequency driving mode.

16. The display apparatus of claim 1, wherein the first gate signal has a first frequency in the low frequency driving mode, wherein the second gate signal has a second frequency in the low frequency driving mode, and wherein the emission signal has a third frequency that is greater than the first frequency and the second frequency in the low frequency driving mode.

17. The display apparatus of claim 16, wherein the second gate signal is generated based on a first gate high voltage level and a first gate low voltage level in the writing frame of the low frequency driving mode, and wherein the second gate signal is generated based on a second gate high voltage level that is lower than the first gate high voltage level and a second gate low voltage level that is greater than the first gate low voltage level in the holding frame of the low frequency driving mode.

18. The display apparatus of claim 17, wherein the first gate signal is generated based on the first gate high voltage level and the first gate low voltage level in the writing frame of the low frequency driving mode, and wherein the first gate signal is generated based on the second gate high voltage level and the second gate low voltage level in at least one of a plurality of holding frames of the low frequency driving mode.

19. The display apparatus of claim 18, wherein the emission signal is generated based on a direct-current ("DC") voltage in the low frequency driving mode.

20. The display apparatus of claim 19, wherein the emission signal is generated based on the first gate high voltage level and the first gate low voltage level in the writing frame of the low frequency driving mode and the holding frame of the low frequency driving mode.

21. The display apparatus of claim 16, wherein the first frequency of the first gate signal is greater than the second frequency of the second gate signal in the low frequency driving mode.

* * * * *